(12) United States Patent
Prevatte et al.

(10) Patent No.: US 10,222,698 B2
(45) Date of Patent: Mar. 5, 2019

(54) CHIPLETS WITH WICKING POSTS

(71) Applicant: X-Celeprint Limited, Cork (IE)

(72) Inventors: Carl Prevatte, Raleigh, NC (US);
Christopher Bower, Raleigh, NC (US);
Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/662,214

(22) Filed: Jul. 27, 2017

(65) Prior Publication Data

US 2018/0031974 A1    Feb. 1, 2018

Related U.S. Application Data

(60) Provisional application No. 62/367,899, filed on Jul. 28, 2016.

(51) Int. Cl.
| | |
|---|---|
| *H01L 23/00* | (2006.01) |
| *G03F 7/20* | (2006.01) |
| *H05K 3/30* | (2006.01) |

(52) U.S. Cl.
CPC ............... *G03F 7/20* (2013.01); *H05K 3/30* (2013.01); *H01L 23/00* (2013.01)

(58) Field of Classification Search
None
See application file for complete search history.

(56) References Cited

U.S. PATENT DOCUMENTS

| | | |
|---|---|---|
| 4,934,267 A | 6/1990 | Hashimoto et al. |
| 5,388,577 A | 2/1995 | Hubbard |
| | (Continued) | |

FOREIGN PATENT DOCUMENTS

| | | |
|---|---|---|
| EP | 0281100 B1 | 6/1992 |
| JP | H11-142878 A | 5/1999 |
| | (Continued) | |

OTHER PUBLICATIONS

U.S. Appl. No. 15/373,865, Cok et al.
(Continued)

*Primary Examiner* — Bradley Smith
(74) *Attorney, Agent, or Firm* — William R. Haulbrook; Michael D. Schmitt; Choate, Hall & Stewart LLP

(57) ABSTRACT

A printable component includes a component substrate and one or more electrical conductors. One or more electrically conductive connection posts protrudes from the component substrate to form an exposed electrical contact. Each connection post is electrically connected to at least one of the electrical conductors and one or more wicking posts protrude from the component substrate. The wicking post can be insulating. In certain embodiments, a printable component source wafer comprises a source wafer, a plurality of sacrificial portions separated by anchor portions formed in a sacrificial layer of the source wafer, and a plurality of printable components. Each printable component is disposed over a corresponding sacrificial portion and connected to an anchor portion by a tether. A destination substrate structure comprises a destination substrate having one or more electrically conductive contact pads, an adhesive layer disposed on the destination substrate, and one or more printable components.

20 Claims, 14 Drawing Sheets

(56) References Cited

U.S. PATENT DOCUMENTS

| | | | |
|---|---|---|---|
| 5,550,066 A | 8/1996 | Tang et al. | |
| 5,557,149 A | 9/1996 | Richards et al. | |
| 5,621,555 A | 4/1997 | Park | |
| 5,815,303 A | 9/1998 | Berlin | |
| 6,025,730 A | 2/2000 | Akram et al. | |
| 6,051,489 A | 4/2000 | Young et al. | |
| 6,142,358 A | 11/2000 | Cohn et al. | |
| 6,180,239 B1 | 1/2001 | Whitesides et al. | |
| 6,277,669 B1 | 8/2001 | Kung et al. | |
| 6,278,242 B1 | 8/2001 | Cok et al. | |
| 6,400,021 B1 | 6/2002 | Cho | |
| 6,448,108 B1 | 9/2002 | Lin | |
| 6,544,813 B1 | 4/2003 | Lin | |
| 6,555,408 B1 | 4/2003 | Jacobsen et al. | |
| 6,577,367 B2 | 6/2003 | Kim | |
| 6,717,263 B2 | 4/2004 | Sawai et al. | |
| 6,717,560 B2 | 4/2004 | Cok et al. | |
| 6,756,576 B1 | 6/2004 | McElroy et al. | |
| 6,841,853 B2 | 1/2005 | Yamada | |
| 6,933,532 B2 | 8/2005 | Arnold et al. | |
| 6,969,624 B2 | 11/2005 | Iwafuchi et al. | |
| 6,974,711 B2 | 12/2005 | Yanagisawa et al. | |
| 6,998,644 B1 | 2/2006 | Boling et al. | |
| 7,127,810 B2 | 10/2006 | Kasuga et al. | |
| 7,129,457 B2 | 10/2006 | McElroy et al. | |
| 7,195,733 B2 | 3/2007 | Rogers et al. | |
| 7,259,391 B2 | 8/2007 | Liu et al. | |
| 7,288,753 B2 | 10/2007 | Cok | |
| 7,380,007 B1 | 5/2008 | Bu et al. | |
| 7,453,157 B2 | 11/2008 | Haba et al. | |
| 7,521,292 B2 | 4/2009 | Rogers et al. | |
| 7,557,367 B2 | 7/2009 | Rogers et al. | |
| 7,586,497 B2 | 9/2009 | Boroson et al. | |
| 7,605,053 B2 | 10/2009 | Couillard et al. | |
| 7,622,367 B1 | 11/2009 | Nuzzo et al. | |
| 7,662,545 B2 | 2/2010 | Nuzzo et al. | |
| 7,667,335 B2 | 2/2010 | Lin et al. | |
| 7,691,656 B2 | 4/2010 | Bader et al. | |
| 7,704,684 B2 | 4/2010 | Rogers et al. | |
| 7,799,699 B2 | 9/2010 | Nuzzo et al. | |
| 7,816,856 B2 | 10/2010 | Cok et al. | |
| 7,893,533 B2 | 2/2011 | Saito | |
| 7,893,612 B2 | 2/2011 | Cok | |
| 7,927,976 B2 | 4/2011 | Menard | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,977,789 B2 | 7/2011 | Park | |
| 7,982,296 B2 | 7/2011 | Nuzzo et al. | |
| 7,999,454 B2 | 8/2011 | Winters et al. | |
| 8,008,182 B2 | 8/2011 | Asakawa | |
| 8,029,139 B2 | 10/2011 | Ellinger et al. | |
| 8,039,847 B2 | 10/2011 | Nuzzo et al. | |
| 8,110,425 B2 | 2/2012 | Yun | |
| 8,198,621 B2 | 6/2012 | Rogers et al. | |
| 8,207,547 B2 | 6/2012 | Lin | |
| 8,261,660 B2 | 9/2012 | Menard | |
| 8,334,545 B2 | 12/2012 | Levermore et al. | |
| 8,394,706 B2 | 3/2013 | Nuzzo et al. | |
| 8,440,546 B2 | 5/2013 | Nuzzo et al. | |
| 8,449,285 B2 | 5/2013 | McGeehan | |
| 8,470,701 B2 | 6/2013 | Rogers et al. | |
| 8,502,192 B2 | 8/2013 | Kwak et al. | |
| 8,506,867 B2 | 8/2013 | Menard | |
| 8,664,699 B2 | 3/2014 | Nuzzo et al. | |
| 8,685,764 B2 | 4/2014 | Chu et al. | |
| 8,686,447 B2 | 4/2014 | Tomoda et al. | |
| 8,722,458 B2 | 5/2014 | Rogers et al. | |
| 8,754,396 B2 | 6/2014 | Rogers et al. | |
| 8,766,970 B2 | 7/2014 | Chien et al. | |
| 8,791,474 B1 | 7/2014 | Bibl et al. | |
| 8,794,501 B2 | 8/2014 | Bibl et al. | |
| 8,803,857 B2 | 8/2014 | Cok | |
| 8,809,672 B2 | 8/2014 | Chuang et al. | |
| 8,817,369 B2 | 8/2014 | Daiku | |
| 8,854,294 B2 | 10/2014 | Sakariya | |
| 8,871,547 B2 | 10/2014 | Chu et al. | |
| 8,877,648 B2 | 11/2014 | Bower et al. | |
| 8,889,485 B2 | 11/2014 | Bower | |
| 8,890,315 B2 | 11/2014 | Choi et al. | |
| 8,895,406 B2 | 11/2014 | Rogers et al. | |
| 8,934,259 B2 | 1/2015 | Bower et al. | |
| 8,963,326 B2 | 2/2015 | Bao et al. | |
| 8,987,765 B2 | 3/2015 | Bibl et al. | |
| 9,082,910 B2 | 7/2015 | Lee et al. | |
| 9,214,410 B2 | 12/2015 | Kim et al. | |
| 9,224,680 B2 | 12/2015 | Chen et al. | |
| 9,238,309 B2 | 1/2016 | King et al. | |
| 9,252,094 B2 | 2/2016 | Choi et al. | |
| 9,307,652 B2 | 4/2016 | Bower | |
| 9,358,775 B2 | 6/2016 | Bower et al. | |
| 9,368,683 B1 | 6/2016 | Meitl et al. | |
| 9,401,344 B2 | 7/2016 | Bower et al. | |
| 9,508,666 B2 | 11/2016 | Yu et al. | |
| 9,550,353 B2 | 1/2017 | Bower et al. | |
| 9,555,644 B2 | 1/2017 | Rogers et al. | |
| 9,704,821 B2 | 7/2017 | Meitl et al. | |
| 2001/0033030 A1 | 10/2001 | Leedy | |
| 2001/0040298 A1 | 11/2001 | Baba et al. | |
| 2002/0050220 A1 | 5/2002 | Schueller et al. | |
| 2003/0027083 A1 | 2/2003 | Fuller et al. | |
| 2003/0183947 A1 | 10/2003 | Ohuchi | |
| 2003/0222353 A1 | 12/2003 | Yamada | |
| 2004/0192041 A1 | 9/2004 | Jeong et al. | |
| 2004/0259290 A1 | 12/2004 | Brintzinger et al. | |
| 2005/0181655 A1 | 8/2005 | Haba et al. | |
| 2005/0202595 A1 | 9/2005 | Yonehara et al. | |
| 2005/0285246 A1 | 12/2005 | Haba et al. | |
| 2006/0051900 A1 | 3/2006 | Shizuno | |
| 2006/0063309 A1 | 3/2006 | Sugiyama et al. | |
| 2007/0075423 A1 | 4/2007 | Ke et al. | |
| 2007/0080464 A1 | 4/2007 | Goebel et al. | |
| 2007/0085102 A1 | 4/2007 | Orita | |
| 2007/0120268 A1 | 5/2007 | Irsigler et al. | |
| 2007/0145550 A1 | 6/2007 | Haba et al. | |
| 2008/0067663 A1 | 3/2008 | Kang et al. | |
| 2008/0108171 A1 | 5/2008 | Rogers et al. | |
| 2008/0111146 A1 | 5/2008 | Nakamura et al. | |
| 2008/0131822 A1 | 6/2008 | Liao et al. | |
| 2008/0150121 A1 | 6/2008 | Oganesian et al. | |
| 2008/0164575 A1 | 7/2008 | Ikeda et al. | |
| 2008/0185705 A1 | 8/2008 | Osborn et al. | |
| 2008/0202365 A1 | 8/2008 | Schneider et al. | |
| 2009/0014205 A1 | 1/2009 | Kobayashi et al. | |
| 2009/0133914 A1 | 5/2009 | Dellmann et al. | |
| 2009/0146303 A1 | 6/2009 | Kwon | |
| 2009/0199960 A1 | 8/2009 | Nuzzo et al. | |
| 2009/0283903 A1 | 11/2009 | Park | |
| 2009/0301771 A1 | 12/2009 | Ochi et al. | |
| 2010/0006876 A1 | 1/2010 | Moteki et al. | |
| 2010/0044826 A1 | 2/2010 | Farooq et al. | |
| 2010/0062098 A1 | 3/2010 | Ando et al. | |
| 2010/0096175 A1 | 4/2010 | Ishimatsu et al. | |
| 2010/0123134 A1 | 5/2010 | Nagata | |
| 2010/0123268 A1 | 5/2010 | Menard | |
| 2010/0147567 A1 | 6/2010 | Hino et al. | |
| 2010/0155989 A1 | 6/2010 | Ishii et al. | |
| 2010/0190293 A1 | 7/2010 | Maeda et al. | |
| 2010/0248484 A1 | 9/2010 | Bower et al. | |
| 2010/0265440 A1 | 10/2010 | French et al. | |
| 2010/0289115 A1 | 11/2010 | Akiyama et al. | |
| 2010/0308008 A1 | 12/2010 | Zhu et al. | |
| 2011/0182805 A1 | 7/2011 | DeSimone et al. | |
| 2011/0215466 A1* | 9/2011 | Hsu | H01L 23/544 257/737 |
| 2011/0219973 A1 | 9/2011 | Gullentops et al. | |
| 2011/0266670 A1 | 11/2011 | England et al. | |
| 2012/0000379 A1 | 1/2012 | Greener et al. | |
| 2012/0043130 A1 | 2/2012 | Rathburn | |
| 2012/0074532 A1 | 3/2012 | Shin et al. | |
| 2012/0104624 A1 | 5/2012 | Choi et al. | |
| 2012/0126229 A1 | 5/2012 | Bower | |
| 2012/0168776 A1 | 7/2012 | Nakamura et al. | |
| 2012/0206421 A1 | 8/2012 | Cok et al. | |

(56) References Cited

U.S. PATENT DOCUMENTS

| | | |
|---|---|---|
| 2012/0228669 A1 | 9/2012 | Bower et al. |
| 2012/0242638 A1* | 9/2012 | Zhong ................ G02B 26/001 345/211 |
| 2012/0256346 A1 | 10/2012 | Ogino et al. |
| 2012/0281379 A1 | 11/2012 | Shimada |
| 2012/0306073 A1 | 12/2012 | Yu et al. |
| 2012/0313207 A1 | 12/2012 | Oganesian |
| 2012/0313241 A1 | 12/2012 | Bower |
| 2012/0314388 A1 | 12/2012 | Bower et al. |
| 2012/0321738 A1 | 12/2012 | Ishii et al. |
| 2012/0328728 A1 | 12/2012 | Nakatsuka et al. |
| 2013/0068720 A1 | 3/2013 | Taniguchi |
| 2013/0069275 A1 | 3/2013 | Menard et al. |
| 2013/0077272 A1 | 3/2013 | Lin et al. |
| 2013/0078576 A1 | 3/2013 | Wu et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0228897 A1 | 9/2013 | Chen et al. |
| 2013/0273695 A1 | 10/2013 | Menard et al. |
| 2013/0293292 A1 | 11/2013 | Droege et al. |
| 2013/0333094 A1 | 12/2013 | Rogers et al. |
| 2013/0337608 A1 | 12/2013 | Kotani et al. |
| 2014/0015124 A1 | 1/2014 | Fay et al. |
| 2014/0084450 A1 | 3/2014 | Nielson et al. |
| 2014/0094878 A1 | 4/2014 | Gossler et al. |
| 2014/0104243 A1 | 4/2014 | Sakariya et al. |
| 2014/0159064 A1 | 6/2014 | Sakariya et al. |
| 2014/0159065 A1 | 6/2014 | Hu et al. |
| 2014/0182912 A1 | 7/2014 | Lin et al. |
| 2014/0252604 A1* | 9/2014 | Motoyoshi ............. H01L 24/11 257/737 |
| 2014/0264763 A1 | 9/2014 | Meitl et al. |
| 2014/0267683 A1 | 9/2014 | Bibl et al. |
| 2014/0327132 A1 | 11/2014 | Zhang et al. |
| 2014/0367633 A1 | 12/2014 | Bibl et al. |
| 2015/0028473 A1 | 1/2015 | Kim et al. |
| 2015/0102807 A1 | 4/2015 | Eckinger et al. |
| 2015/0135525 A1 | 5/2015 | Bower |
| 2015/0137153 A1 | 5/2015 | Bibl et al. |
| 2015/0163906 A1 | 6/2015 | Bower et al. |
| 2015/0348926 A1 | 12/2015 | Bower |
| 2015/0371874 A1 | 12/2015 | Bower et al. |
| 2016/0016399 A1 | 1/2016 | Bower et al. |
| 2016/0018094 A1 | 1/2016 | Bower et al. |
| 2016/0020120 A1 | 1/2016 | Bower et al. |
| 2016/0020127 A1 | 1/2016 | Bower et al. |
| 2016/0020130 A1 | 1/2016 | Bower et al. |
| 2016/0020131 A1 | 1/2016 | Bower et al. |
| 2016/0020187 A1 | 1/2016 | Okada et al. |
| 2016/0056223 A1 | 2/2016 | Bower et al. |
| 2016/0093600 A1 | 3/2016 | Bower et al. |
| 2016/0111387 A1 | 4/2016 | Dang et al. |
| 2016/0262268 A1 | 9/2016 | Co et al. |
| 2017/0047303 A1 | 2/2017 | Meitl et al. |
| 2017/0047306 A1 | 2/2017 | Meitl et al. |
| 2017/0048976 A1 | 2/2017 | Prevatte et al. |
| 2017/0154819 A1 | 6/2017 | Bower et al. |
| 2017/0213803 A1 | 7/2017 | Bower |
| 2017/0287789 A1 | 10/2017 | Bower et al. |
| 2018/0042110 A1 | 2/2018 | Cok |
| 2018/0090394 A1 | 3/2018 | Bower et al. |

FOREIGN PATENT DOCUMENTS

| | | |
|---|---|---|
| JP | 2005 099410 A | 4/2005 |
| WO | WO-2008/103931 A2 | 8/2008 |
| WO | WO-2016/012409 A2 | 1/2016 |
| WO | WO-2017/167954 A2 | 10/2017 |

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.

Cok, R. S. et al., 60.3: AMOLED Displays Using Transfer-Printed Integrated Circuits, Society for Information Display, 10:902-904 (2010).

Foest, R. et al., Kalte Normaldruck-Jetplasmen zur lokalen Oberflächenbehandlung, Vakuum in Forschung and Praxis, 21(6):17-21, (2009).

Hamer et al., 63.2: AMOLED Displays Using Transfer-Printed Integrated Circuits, SID 09 Digest, 40(2):947-950 (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Kim, S. et al, Microstructural elastomeric surfaces with reversible adhesion and examples of their use in deterministic assembly by transfer printing, PNAS, 107(40):17095-17100 (2010).

Roscher, H., VCSEL Arrays with Redundant Pixel Designs for 10Gbits/s 2-D Space-Parallel MMF Transmission, Annual Report, optoelectronics Department, (2005).

Yaniv et al., a 640 x 480 Pixel Computer Display Using Pin Diodes with Device Redundancy, 1988 International Display Research Conference, IEEE, CH-2678-1/88:152-154 (1988).

* cited by examiner

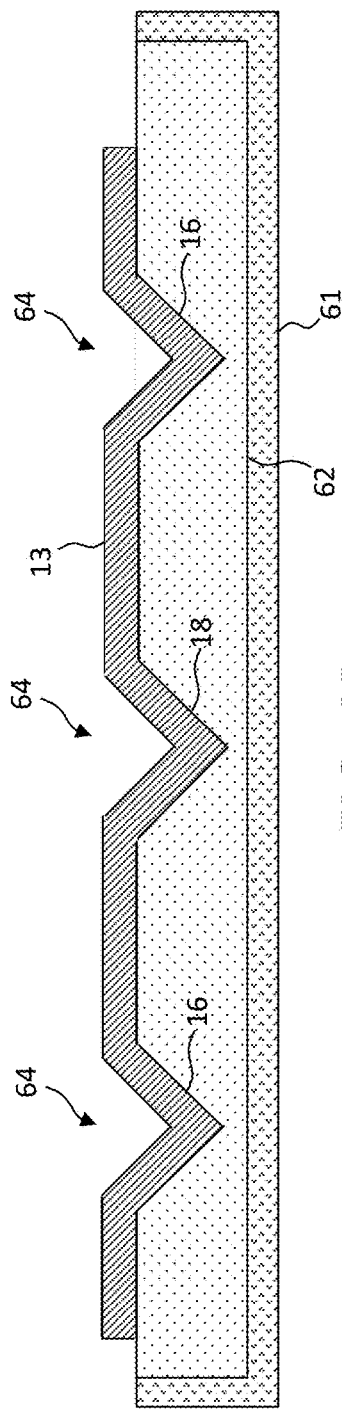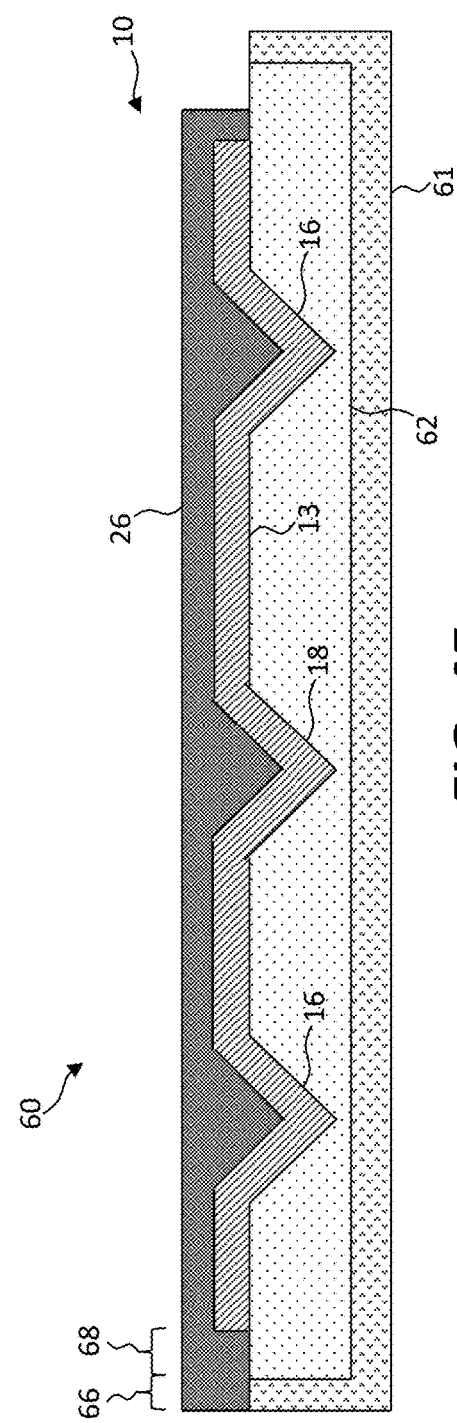

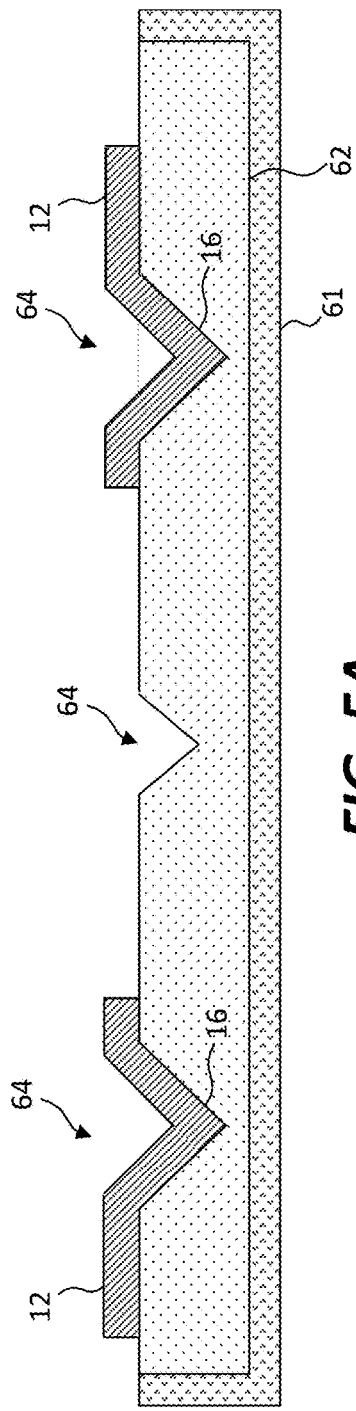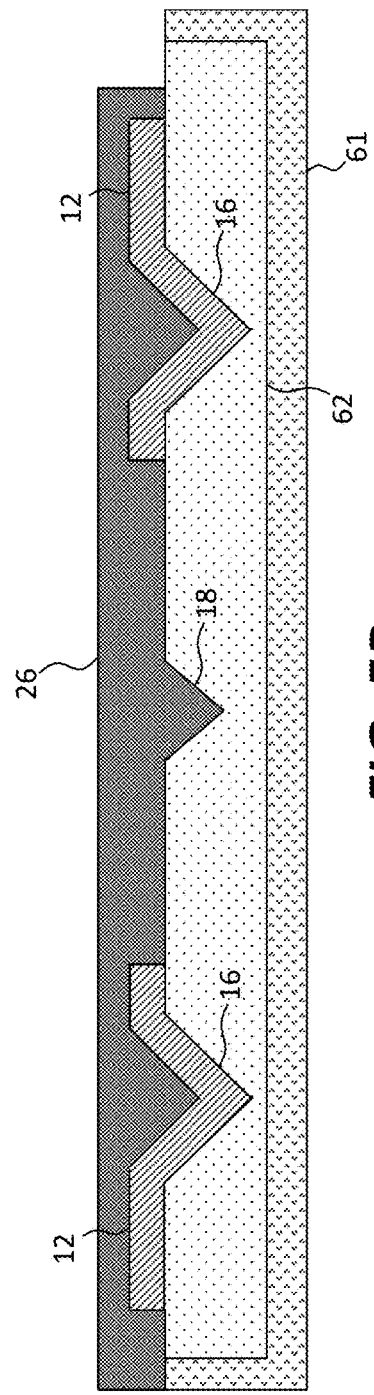

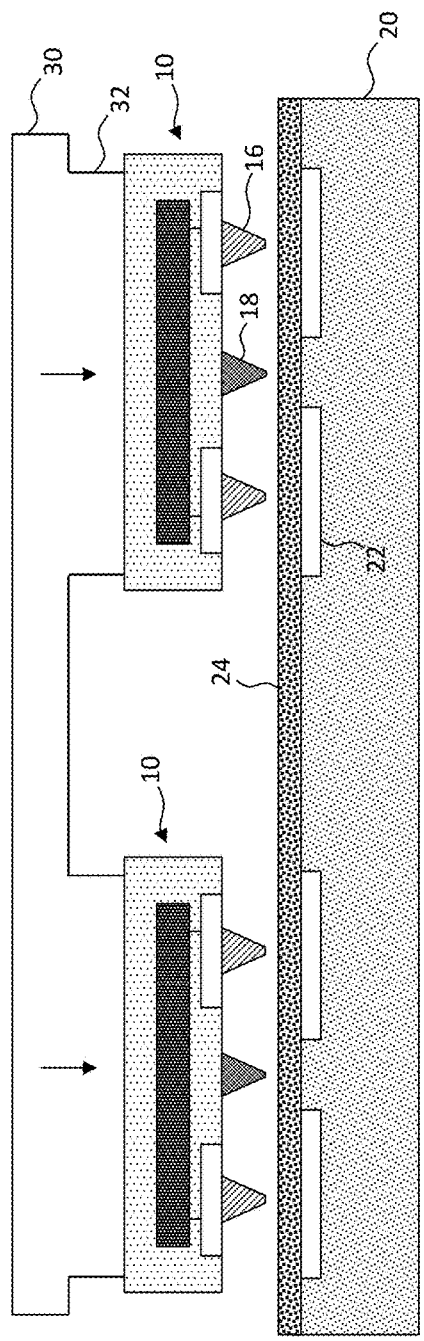
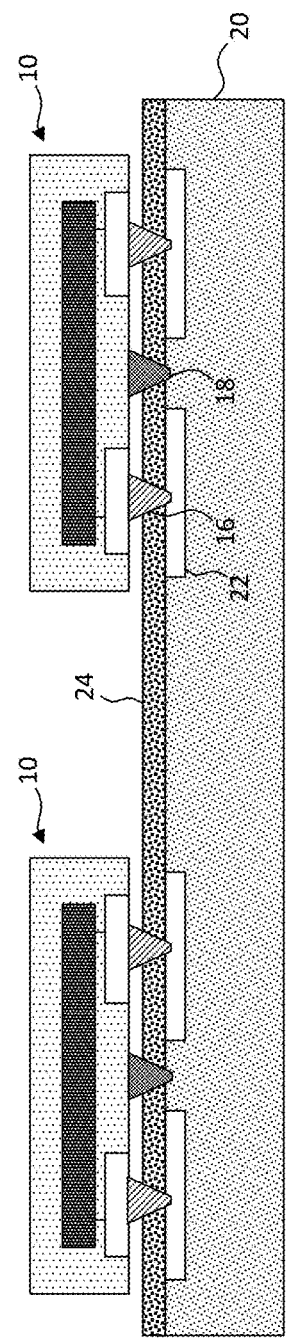
FIG. 6
FIG. 7

CHIPLETS WITH WICKING POSTS

PRIORITY APPLICATION

This application claims priority to and benefit of U.S. Patent Application No. 62/367,899, filed Jul. 28, 2016, entitled Chiplets with Wicking Posts, the disclosure of which is hereby incorporated by reference in its entirety.

CROSS REFERENCE TO RELATED APPLICATION

Reference is made to U.S. Pat. No. 8,889,485, entitled Methods for Surface Attachment of Flipped Active Components by Christopher Bower, to U.S. patent application Ser. No. 14/822,864, entitled Chiplets with Connection Posts by Prevatte et al., and to U.S. patent application Ser. No. 14/743,788, entitled Micro Assembled LED Displays and Lighting Elements by Bower et al., the disclosures of which are incorporated herein by reference in their entirety.

FIELD OF THE INVENTION

The present invention relates to structures and methods for electrically interconnecting chiplets to backplanes by printing (e.g., micro-transfer printing).

BACKGROUND OF THE INVENTION

Substrates with electronically active components distributed over the extent of a substrate are used in a variety of electronic systems, for example, flat-panel imaging devices such as flat-panel liquid crystal or organic light emitting diode (OLED) display devices and in flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging can be used.

The electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application Publication No. 2010/0289115 and U.S. Patent Application Publication No. 2010/0123134. However, such substrate materials can be more expensive or difficult to process.

Other methods used for distributing electronically functional components over a substrate in the circuit board assembly industry include, for example, pick-and-place technologies for integrated circuits provided in a variety of packages, for example, pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled Formation of Display Transistor Array Panel describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In some embodiments, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Other methods for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods, it is generally necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Additional layers, such as interlayer dielectric insulators can also be required. This process is expensive and requires a number of manufacturing steps. Moreover, the topographical structure of the small integrated circuits over the destination substrate renders the electrical connections problematic. For example, it can be difficult to form a continuous conductor from the destination substrate to the small integrated circuit because of the differences in height over the surface between the small integrated circuits and the destination substrate.

There is a need, therefore, for robust structures and methods that enable the electrical interconnection of small integrated circuits, such as micro-transfer printed chiplets, to destination substrates.

SUMMARY OF THE INVENTION

The present invention provides, inter alia, structures and methods for electrically connecting relatively small electrical components such as integrated circuit chiplets to a relatively large destination substrate in an efficient, robust, and cost-effective way. In accordance with some embodiments of the present invention, a printable component comprises a component substrate and one or more electrical conductors, one or more electrically conductive connection posts protruding from the component substrate to form an exposed electrical contact to conduct an electrical signal, each connection post electrically connected to at least one of the electrical conductors, and one or more wicking posts protruding from the component substrate. In certain embodiments, the one or more wicking posts do not conduct an electrical signal and are electrically isolated from the one or more conductive connection posts.

In certain embodiments, a wicking post is not electrically conductive. In some embodiments, a wicking post is electrically conductive. In some embodiments, one or more wicking posts are electrically conductive and one or more wicking posts are not electrically conductive. In some embodiments, wicking posts are directly connected to electrical conductors, are connected to electrical conductors, or are electrically isolated from electrical conductors. Wicking posts can comprise the same or different materials as connection posts and can have a different height or the same height as the connection posts. In some embodiments, a wicking post cannot conduct an electrical signal (e.g., to a circuit) (e.g., is not electrically conductive). In some embodiments, a wicking post does not conduct an electrical signal (e.g., is not electrically connected to a circuit).

In various embodiments of the present invention, a printable component is an electrical jumper, includes one or more of a passive circuit, an active circuit, a light-emitting diode (LED), a photodiode, a transistor, an information processor, or a sensor, each with one or more electrical connections that are directly or indirectly electrically connected to one or more of the connection posts. A printable component can have at least one of a width, length, and height from 2 to 5 µm, 5 to 10 µm, 10 to 20 µm, or 20 to 50 µm and can include one or more broken tethers.

In certain embodiments, a printable component source wafer comprises a source wafer, a plurality of sacrificial portions separated by anchor portions formed in a sacrificial layer of the source wafer, and a plurality of printable components. Each printable component is disposed over a corresponding sacrificial portion and connected to an anchor portion by a tether. In various embodiments, the source wafer comprises wafer material and the wafer material is anisotropically etchable and the sacrificial portions are designated portions of the anisotropically etchable material, the sacrificial portions comprise material that is differentially etchable from the wafer material, or the sacrificial portions comprise a gap between the printable component and the wafer material.

In certain embodiments a destination substrate structure comprises a destination substrate having one or more electrically conductive contact pads, an adhesive layer disposed on the destination substrate, and one or more printable components. The adhesive layer can be patterned or unpatterned. Each connection post of each printable component extends through the adhesive layer and is in electrical contact with a corresponding contact pad and each wicking post is in contact with the adhesive layer and can be spatially separate from every contact pad on the destination substrate. The adhesive can be a curable adhesive that wicks over the wicking post when the adhesive is uncured and is a solid adhesive when cured. In certain embodiments, the adhesive material underfills the volume and applies compression between the printable component and the destination substrate.

In certain embodiments, a method of making a destination substrate structure comprises providing a printable component source wafer, providing a micro-transfer stamp, and providing a destination substrate having one or more electrically conductive contact pads and an uncured curable adhesive layer disposed on the destination substrate. The adhesive layer is optionally patterned. The printable components are micro-transfer printed from the source wafer to the destination substrate so that each connection post of each printable component extends through the adhesive layer and is in electrical contact with a corresponding contact pad and so that each wicking post is in contact with the adhesive layer and is spatially separate from every contact pad. The adhesive layer is cured.

In some embodiments of the present invention, two or more connection posts are provided to contact a common destination substrate contact pad. In certain embodiments, the connection posts are disposed in groups, the connection posts within a group are electrically connected to a common destination substrate contact pad and the connection posts in different groups are electrically connected to different destination substrate contact pads. By providing two or more connection posts in contact with a common destination substrate contact pad, faults in electrical connections between the component and the destination substrate contact pad are reduced by providing a redundant electrical connection from the component to the destination substrate contact pad.

Because components can be made using integrated circuit photolithographic techniques having a relatively high resolution and cost and the destination substrate, for example a printed circuit board, can be made using printed circuit board techniques having a relatively low resolution and cost, the destination substrate contact pads on the destination substrate can be much larger than the connection posts or electrical contacts on the component, facilitating the use of multiple connection posts with common destination substrate contact pads, reducing electrical faults, and reducing manufacturing costs.

In one aspect, the disclosed technology includes a printable component including a chiplet having a semiconductor substrate and a plurality of electrical connections. Each electrical connection comprises an electrically conductive connection post protruding from the semiconductor substrate In certain embodiments, the destination substrate is a member selected from the group consisting of polymer, plastic, resin, polyimide, PEN, PET, metal, metal foil, glass, a semiconductor, and sapphire. In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In another aspect, the disclosed technology includes a method of making a printable component, including: providing a forming substrate having two or more forms in a surface of the substrate; disposing a patterned layer of conductive material at least in the forms to make connection posts; disposing a first dielectric layer over the patterned layer of conductive material and the forming substrate; disposing a circuit having circuit contact pads on the first dielectric layer, for example by micro-transfer printing a chiplet; forming conductors electrically connecting the connection posts to the circuit contact pads; and defining the printable component to form a release layer and anchors in the forming substrate connected by tethers to the printable component.

In certain embodiments, the method includes providing a destination substrate having two or more destination substrate contact pads; and micro-transfer printing the printable component to the destination substrate so that each connection post is in contact with, extends into, or extends through a destination substrate contact pad of the destination substrate to electrically connect the destination substrate contact pads to the connection posts, the circuit contact pads, and the circuit. In certain embodiments, the method includes disposing a patterned second dielectric layer over the first dielectric layer, the conductors, and the circuit.

In certain embodiments, the connection post or wicking post has a height that is greater than its base width, has a base width that is greater than its peak width, or has a base area that is greater than its peak area.

The present invention provides, inter alia, structures and methods that enable the construction of electrical interconnections between small integrated circuits that are micro-transfer printed on a destination substrate. In certain embodiments, the electrical interconnection process is simple, robust, and inexpensive requiring fewer process steps than known alternative methods.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 4A-4F are sequential cross sections illustrating steps in the construction of an illustrative embodiment of the present invention in a method of the present invention;

FIGS. 5A-5F are sequential cross section illustrating steps in the construction of another illustrative embodiment of the present invention in a method of the present invention;

FIGS. 6-8 are sequential cross sections illustrating a micro-transfer printing method according to an illustrative embodiment of the present invention;

Figure 1:
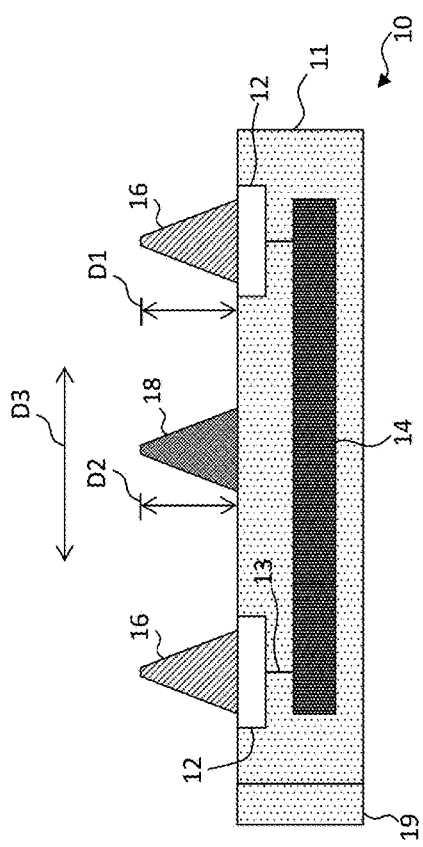
FIG. 1 is a cross section of an illustrative embodiment of the present invention having posts of substantially equal height.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides, inter alia, a structure and method for electrically connecting relatively small electrical components such as integrated circuit chiplets to a relatively large destination substrate in an efficient, robust, and cost-effective way. Referring to the cross sections of FIGS. 1-3, in various embodiments of the present invention, a printable component 10 includes a component substrate 11 with one or more electrical conductors 13 formed or disposed in or on the component substrate 11. One or more electrically conductive connection posts 16 protrude from the component substrate 11 to form one or more exposed electrical contacts. Optional component contact pads 12 can electrically connect the connection posts 16 to the electrical conductors 13. Each connection post 16 is electrically connected to at least one of the electrical conductors 13. An exposed electrical contact is an electrically conductive element that is available, for example without further processing, to form a direct electrical connection with a device or structure external to a printable component 10.

Figure 2:
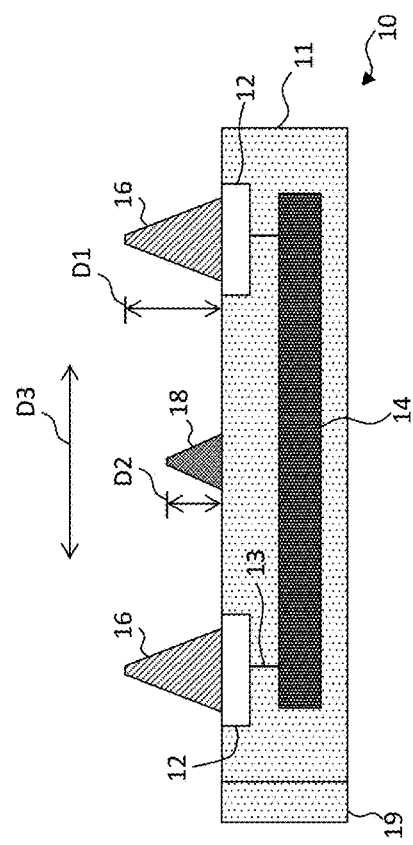
FIG. 2 is a cross section of another illustrative embodiment of the present invention having posts of different height.

As shown in FIGS. 1 and 2, connection posts 16 protrude from a component substrate 11 by a connection post distance D1 and one or more wicking posts 18 protrude from the component substrate 11 by a wicking post distance D2. As shown in FIG. 1, the connection post distance D1 is substantially equal to the wicking post distance D2. By substantially equal is meant within the tolerances of the manufacturing process and materials used to make the connection posts 16 and the wicking posts 18. As shown in FIG. 2, the connection post distance D1 is greater than to the wicking post distance D2.

Figure 3:
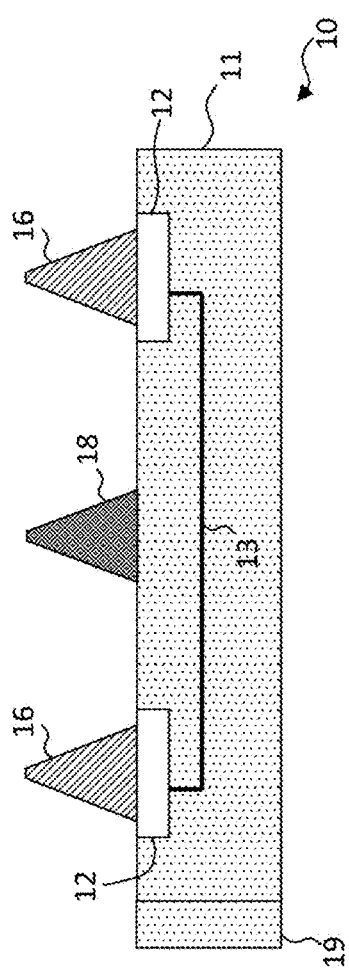
FIG. 3 is a cross section of an alternative illustrative embodiment of the present invention forming an electrical jumper.

As shown in the illustrative embodiments of FIGS. 1 and 2, a circuit 14 is formed or disposed in or on a component substrate 11. The circuit 14 is electrically connected to one or more of the electrical conductors 13 and thus to one or more corresponding connection posts 16. As shown in FIG. 3, in some embodiments of the present invention, two connection posts 16 are directly electrically connected with a wire 13 so that the printable component 10 can be an electrical jumper. By directly electrically connected, it is meant that the wire 13 is electrically connected between the two connection posts 16 and no other electrical component is electrically connected in series between either of the two connection posts 16 and the wire 13. A wire 13 can be considered a primitive circuit 14, so that references to the circuit 14 include references to a wire 13 or to a circuit 14 having only one or more wires 13 without other active or passive components. A printable component 10 can be a micro-transfer printable component 10 and include broken tethers 19 when disposed on a destination substrate and connection posts 16 electrically connected to destination substrate contact pads on the destination substrate using micro-transfer printing, as discussed further below.

Connection posts 16 and wicking posts 18 can protrude in a direction orthogonal to a surface of the component substrate 11. Connection posts 16 are electrically conductive, for example, having an electrically conductive coating such as a metal coating (e.g., silver, gold, aluminum, tin, tungsten, titanium, or tantalum or alloyed or layered combinations thereof). In contrast, wicking posts 18 can be, but need not necessarily be, electrically conductive and can, for example, comprise a dielectric such as silicon nitride or silicon dioxide.

A component substrate 11 can be a semiconductor substrate suitable for forming integrated circuits. Wires 13 and circuit 14 can be formed (e.g., in a semiconductor substrate) using photolithographic techniques and materials. The semiconductor substrate can be doped, undoped, or include a plurality of various semiconductor layers or non-semiconductor layers, such as planarizing layer(s), insulating layer(s), electrically conductive layer(s) such as patterned metal layer(s), or combinations thereof. In certain embodiments, component substrate 11 comprises a non-semiconductor material such as glass, ceramic, or polymer in or on which electrical conductors 13 can be formed or on which circuits 14 can be disposed, for example by micro-transfer printing.

In various embodiments, circuit 14 can be an analog or digital circuit for processing information, a light-output circuit such as a light-emitting diode (LED), a light-collecting circuit such as a photovoltaic cell, or a sensor such as a photo-detector or other environmental sensor. The circuit 14 can be formed in or on the component substrate 11, for example, using integrated circuit techniques and materials. In some embodiments, a component substrate 11 is a first component substrate 11 and a circuit 14 is formed in or on a second component substrate, different from the first component substrate 11, wherein the second component substrate is disposed on the first component substrate 11, for example, by micro-transfer printing. Thus, a printable component 10 can be an active component having an active element, a passive component having a passive element, or a compound structure having a plurality of active elements, a plurality of passive elements, or a combination of one or more active and one or more passive elements and devices with one or more substrates. Active elements can include transistors and passive elements can include electrical conductors (wires) 13, resistors, and capacitors. A printable component 10 can have at least one of a width, length, and height from 2 to 5 μm, 5 to 10 μm, 10 to 20 μm, or 20 to 50 δm and, in certain embodiments, can be micro-transfer printed.

Wicking posts 18 can be arranged arbitrarily with respect to the connection posts 16. In some embodiments, a printable component 10 includes at least two connection posts 16 and at least one wicking post 18 is between at least two of the connection posts 16 in a direction (D3) parallel to a surface of the component substrate 11 (as shown in FIG. 1). In some embodiments, at least two wicking posts 18 are located closer to the corners of the component substrate 11 than the connection posts 16 so that one connection post 16 is between the two wicking posts 18 in a direction (D3) parallel to a surface of the component substrate 11. These arrangements can increase stability during the micro-transfer printing process or in subsequent post-processing steps, such as adhesive curing.

In some embodiments of the present invention, connection posts 16 and wicking posts 18 each comprise the same materials in the same amounts or in different amounts. In some embodiments, a wicking post 18 includes one or more wicking post materials that is different from any of the materials in the connection post 16 or the connection post 16 includes one or more connection post materials that is different from any of the materials in the wicking post 18. In some embodiments, a wicking post 18 is not electrically conductive or includes silicon nitride, silicon dioxide, or a resin such as a cured resin.

In some embodiments, a wicking post 18 cannot conduct an electrical signal (e.g., to a circuit) (e.g., is not electrically conductive). In some embodiments, a wicking post 18 does not conduct an electrical signal (e.g., is not electrically connected to a circuit). In some embodiments, a printable component 10 comprises a circuit 14 (e.g., an electronic circuit). An electronic circuit 14 can conduct electrical signals to one or more connection posts 16. In some embodiments, a conductive wicking post 18 is in physical contact with a destination substrate 20, but not in electrical contact with the destination substrate (e.g., does not contact a destination substrate contact pad 22). In some embodiments, a wicking post 18 is not electrically conductive, but can be in contact with elements of an electronic circuit 14. A non-conductive wicking post 18 cannot conduct an electrical signal. In some embodiments, a wicking post 18 is electrically conductive, but is not electrically connected to any circuit 14 or any other element, such that no electrical signal travels through the wicking post 18 (i.e., the wicking post 18 does not conduct an electrical signal). In certain embodiments, whether conductive or non-conductive, a wicking post 18 does not and/or cannot conduct an electrical signal.

Figure 4A:
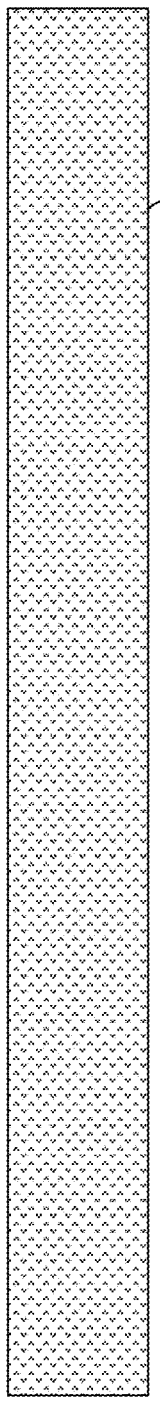
Figure 4B:
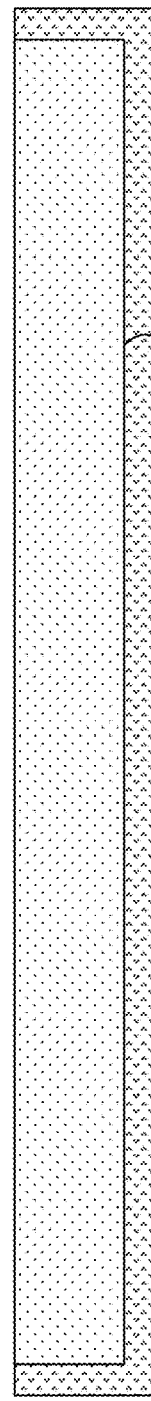
Figure 4C:
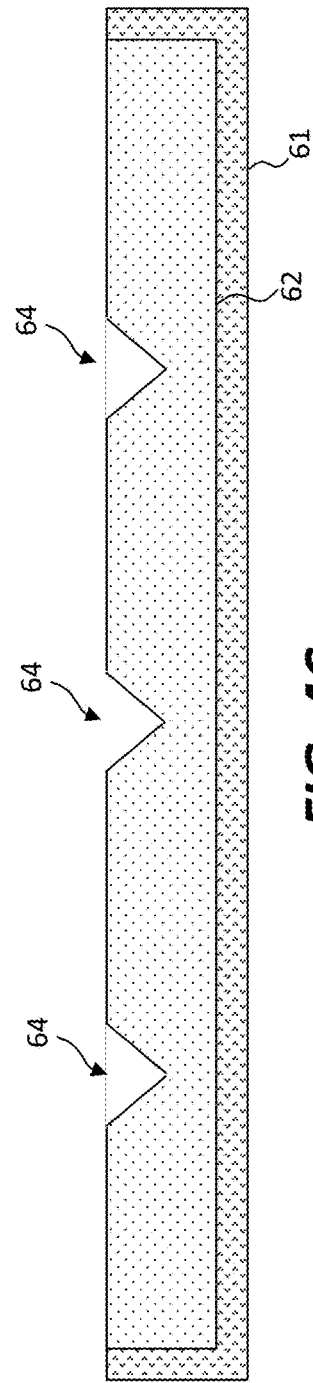
Figure 4F:
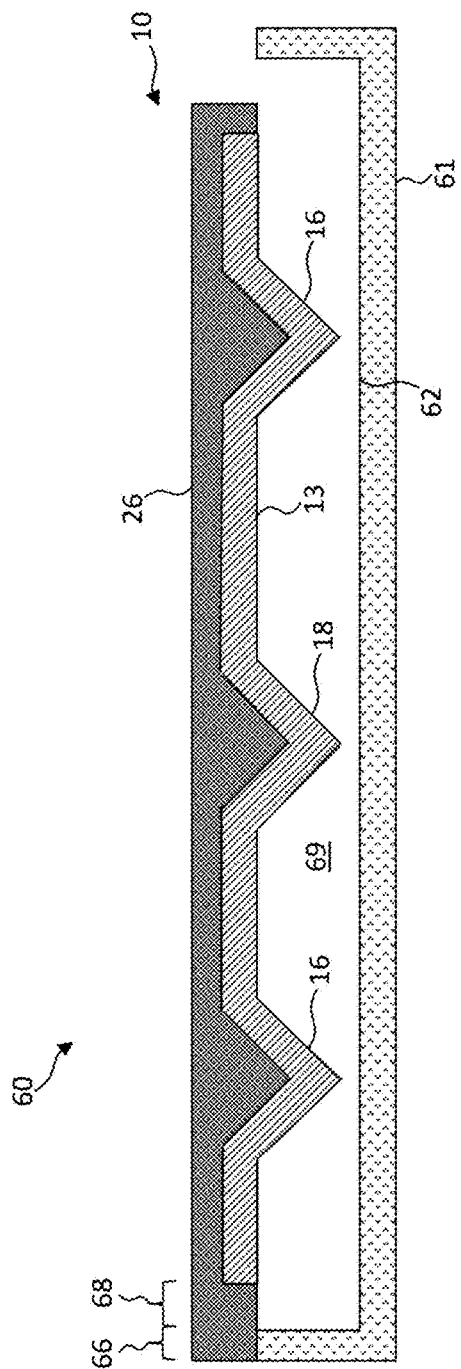

Referring to FIGS. 4A-4F, a printable component 10 according to some embodiments of the present invention can be made by processing a suitable source wafer 61 using photolithographic processes. A source wafer 61 can be, for example, a semiconductor (such as silicon), glass, metal, or ceramic wafer. Where a printable component 10 is a jumper (as shown in FIG. 3), the source wafer 61 need not be a semiconductor. Suitable source wafers 61 are commercially available and is provided (as shown in FIG. 4A) and a sacrificial layer patterned or designated on or over the source wafer 61 to form sacrificial portions 62 (as shown in FIG. 4B). At this stage of the process, the sacrificial portions 62 can be designated portions of an anisotropically etchable material (such as silicon) or patterned layers of materials such as oxides, for example silicon dioxide, that are differentially etchable from the source wafer 61. As shown in FIG. 4C, the sacrificial portions 62 can be pattern-wise etched to make forms 64 in the sacrificial portions 62, for example pyramidal depressions, holes, or indentations. Referring next to FIG. 4D, a patterned metal layer (or other patterned conductive layer) is formed over the sacrificial portions 62 and in the forms 64 that electrically connects the portions of the metal in the forms 64. The patterned metal layer can make the electrical conductors 13, the connection posts 16, and the wicking posts 18 in the printable component 10. In some embodiments, the patterned metal layer excludes the wicking post forms 64 so that the wicking posts 18 are not electrically conductive but the patterned metal layer still electrically connects the forms 64 for the connection posts 16. A layer 26 of dielectric material, for example an oxide or nitride such as silicon dioxide or silicon nitride, is coated over the patterned metal layer to protect it (as shown in FIG. 4E). In some embodiments, the dielectric material 26 layer is a planarizing layer. The sacrificial portion 62 is then etched to undercut the printable component 10 forming a gap 69 (i.e., an empty space) and tethers 68 physically connecting the printable component 10 to an anchor 66 portion of the source wafer 61 (as shown in FIG. 4F). The gap 69 is between the printable component 10 and the source wafer 61. The deposition, patterning, and etching can be done using known photolithographic processes.

Referring to FIGS. 5A-5F, micro-transfer printable components 10 according to some embodiments of the present invention having circuits 14 can be made on a source wafer 61 using photolithographic processes. In some embodiments of the present invention, the source wafer 61 is not a semiconductor, for example, glass, metal, or ceramic wafer and the circuit 14 is provided by micro-transfer printing a small integrated circuit such as a chiplet from a chiplet source wafer to the source wafer 61. The chiplet has a substrate separate and independent of the component substrate 11 and can comprise a different material than the component substrate 11 material. For example, the chiplet substrate can be a compound semiconductor and the component substrate 11 material can be a semiconductor or glass. In some embodiments, the chiplet substrate is a silicon semiconductor and the component substrate 11 material can be glass. In some embodiments of the present invention, the source wafer 61 is a semiconductor, for example silicon, and the circuit 14 is formed using photolithographic methods and materials in or on the source wafer 61. Suitable source wafers 61 are commercially available.

Figure 5C:
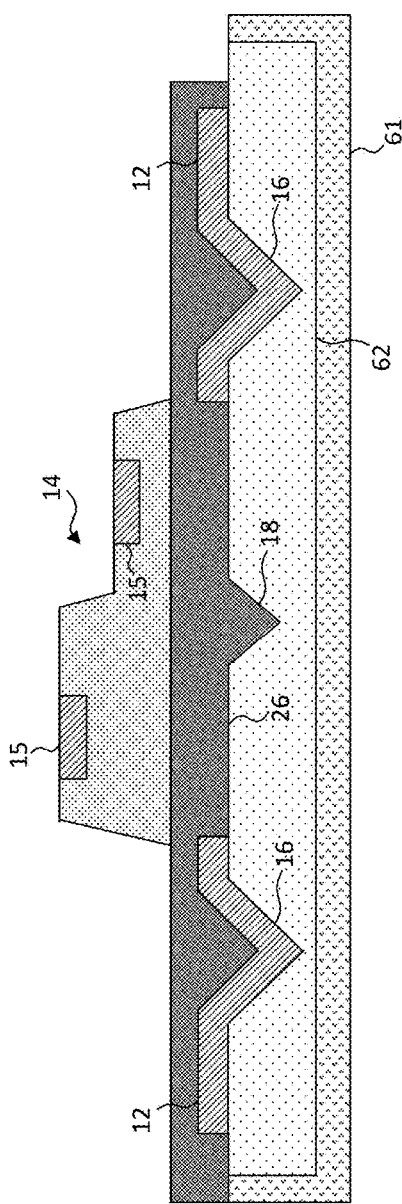

In the process of FIGS. 5A-5F, the processing steps shown in FIGS. 4A-4C are first carried out on the source wafer 61. However, the patterned metal layer of FIG. 4D is patterned differently as shown in FIG. 5A to provide electrically separate electrical connections from the connection posts 16 to the circuit 14. In some embodiments, no metal is provided over the form 64 corresponding to the wicking post 18 (as shown in FIGS. 1-3). Referring to FIG. 5B, the layer 26 of dielectric is coated and can be a planarizing layer (as shown in FIG. 4E). The wicking post 18 can therefore be made entirely of the dielectric material and can therefore be non-conductive. Referring to FIG. 5C, circuits 14 (for example, such as LEDs or integrated-circuit chiplets) are micro-transfer printed to the dielectric layer 26. Alternatively, circuits 14 can be formed on the surface of the dielectric layer 26. The circuits 14 can have optional circuit contact pads 15 with which to make electrical contact to the circuit 14. For example, the circuit 14 can be a horizontal LED that emits light through the dielectric layer 26. In this case, the source wafer 61 can be a non-semiconductor.

Figure 5D:
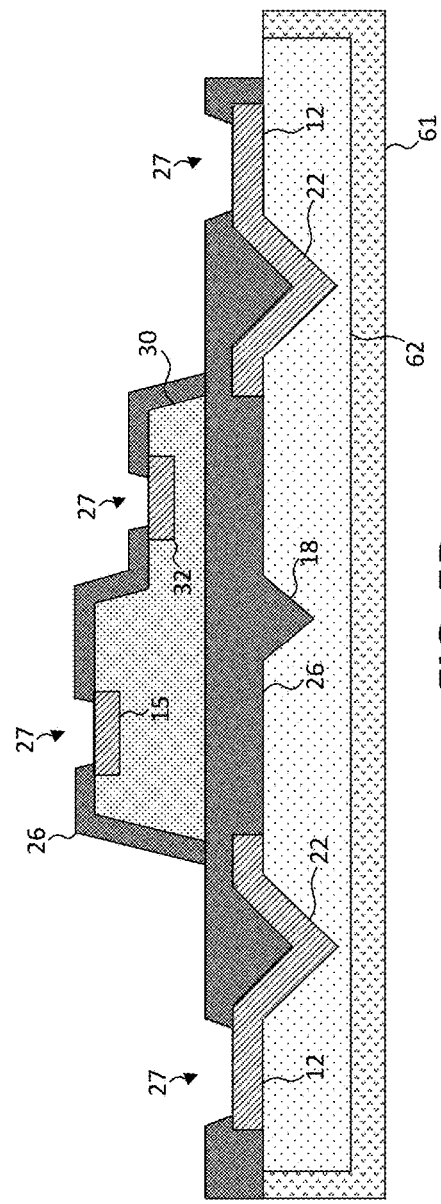
Figure 5E:
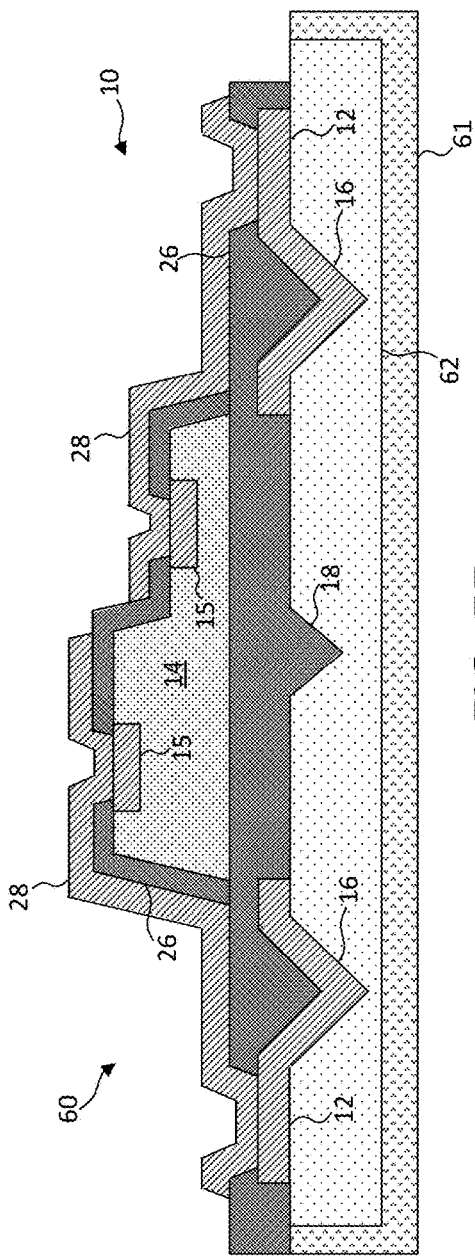
Figure 5F:
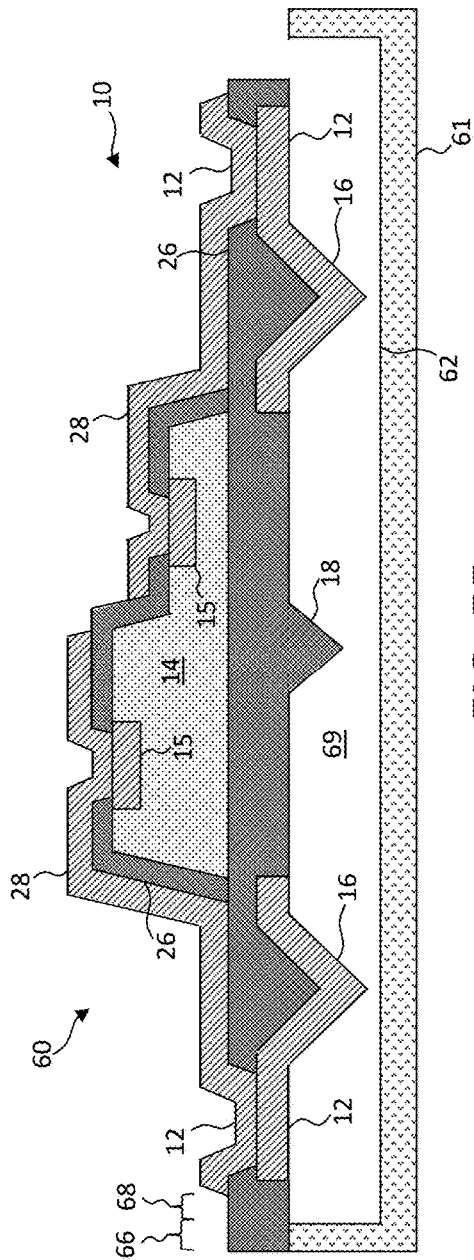

A second dielectric layer 26 is deposited and patterned over the circuit 14 with vias 27 opened for each of the optional circuit contact pads 15 (as shown in FIG. 5D) and component contact pads 12. Referring to FIG. 5E, electrodes 28 for controlling the circuit 14 are patterned over the dielectric layers 26 and connect the circuit contact pads 15 through the vias 27 and component contact pads 12 to the connection posts 16. Next, as shown in FIG. 5F, the sacrificial portions 62 can be etched to make the micro-transfer printable components 10, gap 69, tethers 68, and anchors 66.

In some embodiments of the present invention, a printable component source wafer 60 includes a source wafer 61 comprising wafer material. A plurality of sacrificial portions 62 are separated by anchor 66 portions formed in a sacrificial layer of the source wafer 61. A plurality of printable components 10 are disposed over a corresponding sacrificial portion 62 and each printable component 10 is connected to an anchor 66 by one or more tethers 68. In various embodiments, the wafer material is anisotropically etchable and the sacrificial portions 62 are designated portions of the anisotropically etchable material, the sacrificial portions 62 comprise material that is differentially etchable from the wafer material, or the sacrificial portions 62 comprise a gap between the printable component 10 and the wafer material.

Figure 9:
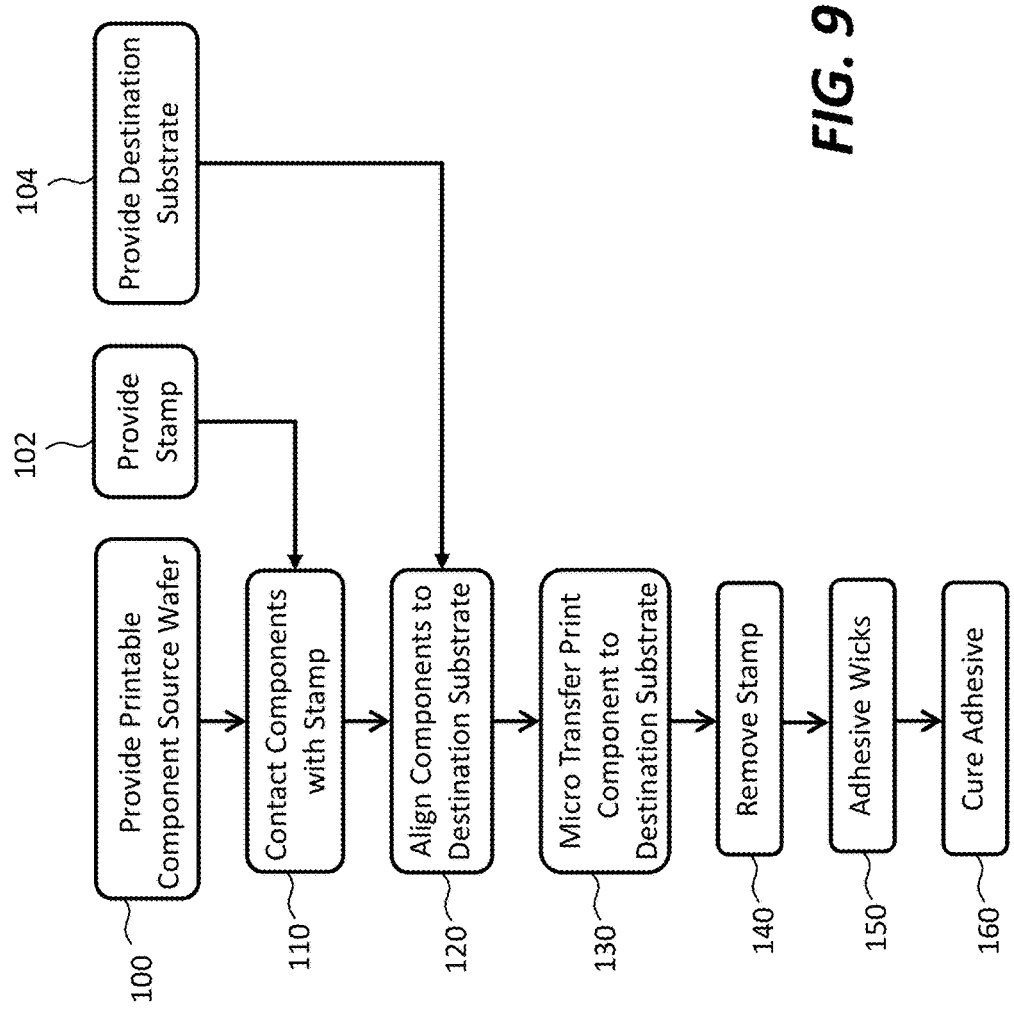
FIG. 9 is a flow chart illustrating a method according to an illustrative embodiment of the present invention.

Once constructed, referring to FIGS. 6 and 9, a printable component 10 can be micro-transfer printed from the printable component source wafer 60 provided in step 100 to a destination substrate 20 having an uncured curable adhesive layer 24 provided in step 104 with an elastomeric transfer stamp 30 provided in step 102. The elastomeric transfer stamp 30 has pillars 32 corresponding to the location of each micro-transfer printable component 10 on the printable component source wafer 60. The printable components 10 are released from the printable component source wafer 60 by contacting each printable component 10 with a stamp pillar 32 in step 110 to break the tether 68 making a broken tether 19 (as shown in FIGS. 1-3) and adhere the printable components 10 to the pillars 32. The transfer stamp 30 is then translated and aligned to the destination substrate 20 in step 120 and each printable component 10 is pressed against the destination substrate 20 in the desired location in step 130 so that the connection posts 16 are electrically contacted to the destination substrate contact pads 22 through the adhesive layer 24 and the printable component 10 is adhered to the destination substrate 20 (as shown in FIG. 7).

Figure 8:
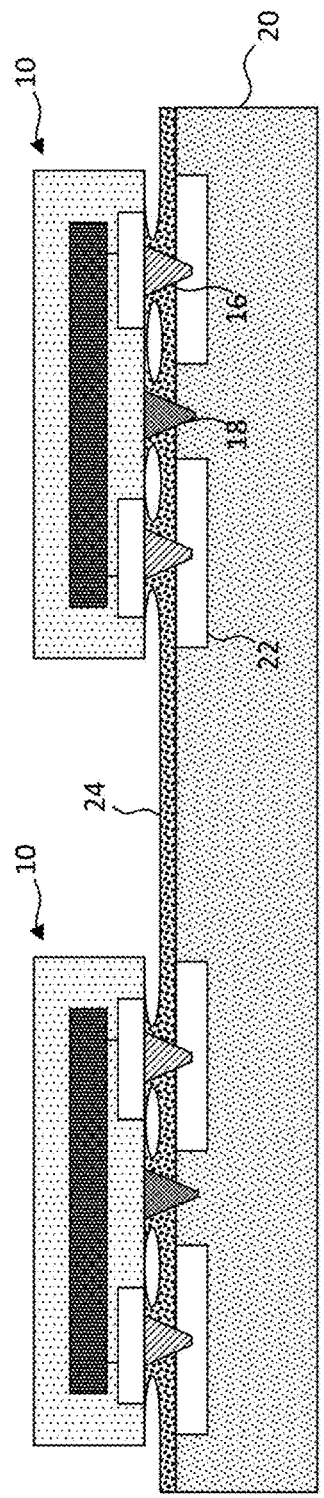

Referring to FIG. 8, the uncured adhesive layer 24 is liquid or at least has a viscosity that allows the uncured adhesive layer 24 to flow and wicks along the surface of the printable component 10 in step 140. In particular, in certain embodiments, the additional area of and contact with the adhesive layer 24 provided by the wicking post 18 distributes the uncured adhesive layer 24 in a thinner layer over a greater area. The transfer stamp 30 is then removed in step 150 and the uncured adhesive layer 24 is then cured in step 160 to form a cured adhesive layer 24 to adhere the printable component 10 to the destination substrate 20. The stamp 30 can be removed after the adhesive layer 24 is partially or completely cured (not shown in FIG. 9). In some embodiments of the present invention, the adhesive layer 24 curing process shrinks the adhesive layer 24 (for example by 10%-20%), pulling the printable component 10 to the destination substrate 20 and thereby more firmly forming the electrical connection between the connection posts 16 and the destination substrate contact pads 22. As used herein, a printable component 10 can be a printed component 10 after it is micro-transfer printed from a printable component source wafer 60 to a destination substrate 20.

Figure 10:
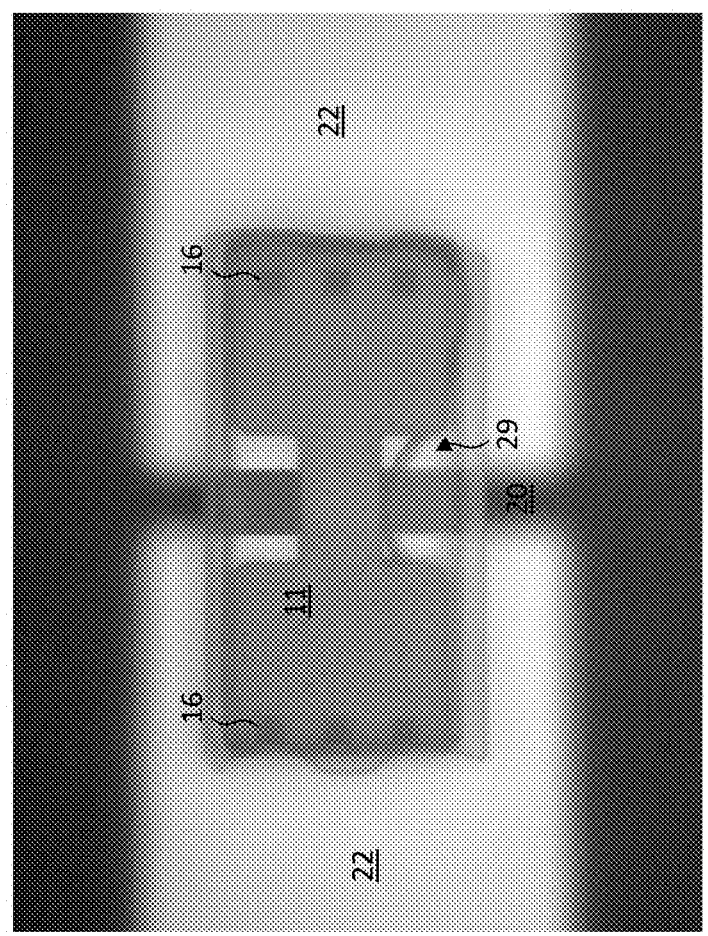
FIG. 10 is a micrograph illustrating an adhesive void for a micro-transfer printed component with connection posts according to an illustrative embodiment of the present invention.

FIG. 10 is a micrograph illustrating a problem certain embodiments of the present invention at least partially address. Referring to FIG. 10, a void 29 is present in the adhesive layer 24 where the adhesive failed to wet over the entire surface of the component substrate 11. Using wicking posts 18 with connection posts 16 to form electrical connections in a micro-transfer printing process improves printable component 10 adhesion to the destination substrate 20. In particular, wicking posts 18 can improve the distribution of adhesive in the adhesive layer 24 over the surface of the printable component 10, thereby reducing the frequency and size of voids 29 (air gaps) in the adhesive layer 24 and increasing the adhered area so that fewer voids 29 were observed. Furthermore, wicking posts 18 provide mechanical support to the component substrate 11 in a printing (e.g., micro-transfer printing) process, helping to prevent stress in the component substrate 11 and avoid cracks in the component substrate 11. Without wishing to be bound by any theory, stress is prevented and cracks avoided especially in certain embodiments when wicking posts 18 are located at the periphery and corners of the component substrate 11. Locating wicking posts 18 at the edge of a printable component 10 helps to protect the printable component 10 against the shear forces in the micro-transfer printing process.

Figure 11:
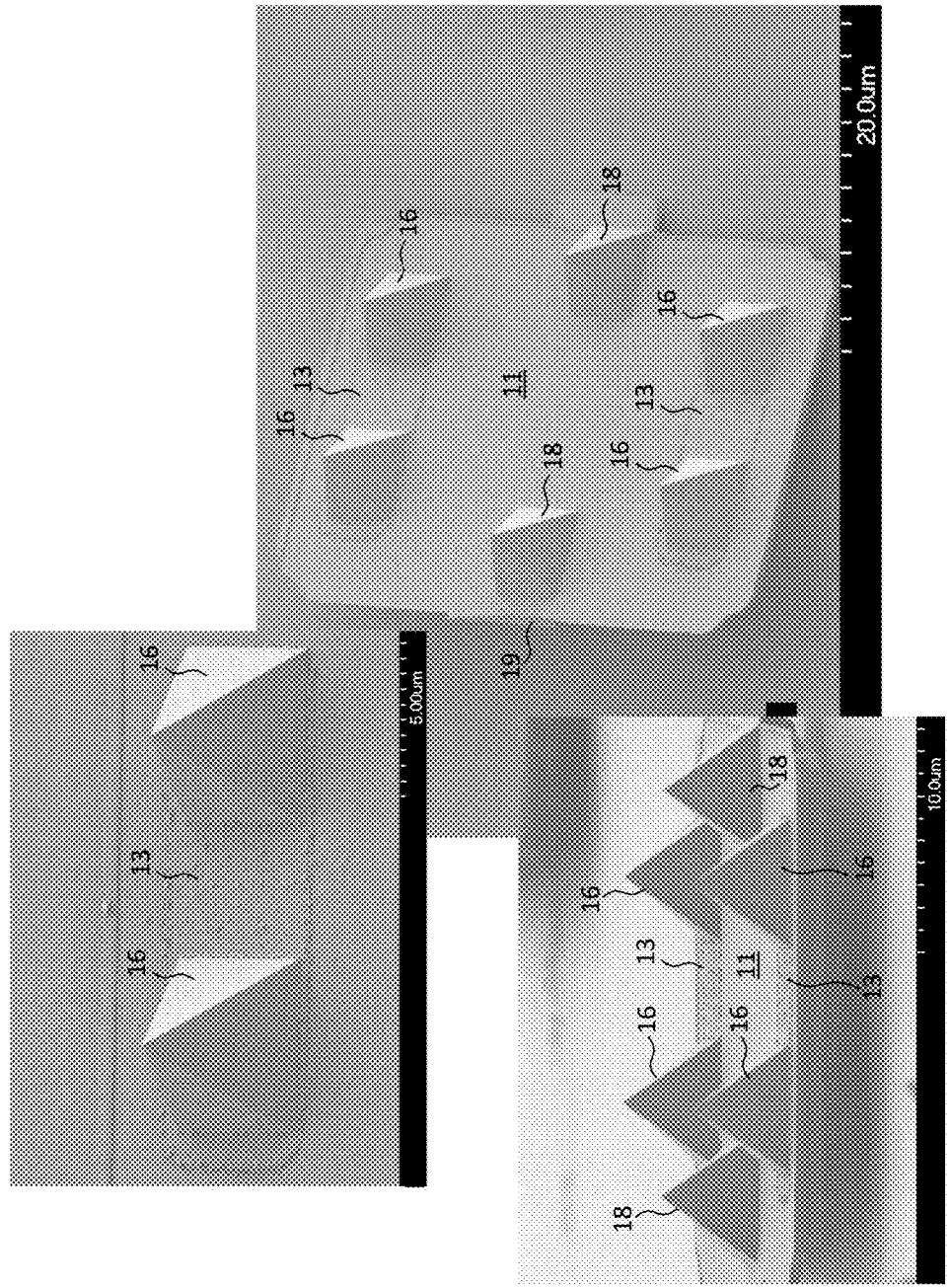
FIG. 11 shows micrographs having different magnifications and at different angles of an electrical jumper printable component according to an illustrative embodiment of the present invention.

Printable components 10 in accordance with certain embodiments of the present invention have been constructed, micro-transfer printed onto a destination substrate 20, and successfully operated. Referring to FIG. 11, micrographs of an illustrative embodiment of the printable component 10 of the present invention are shown. FIG. 10 includes three scanning electron microscope (SEM) views at different magnifications and at different angles showing the connection posts 16 and wicking posts 18 of the printable component 10 schematically illustrated in FIG. 3, wherein the printable component forms an electrical jumper. This exemplary electrical jumper has two wicking posts 18 and four connection posts 16.

Figure 12:
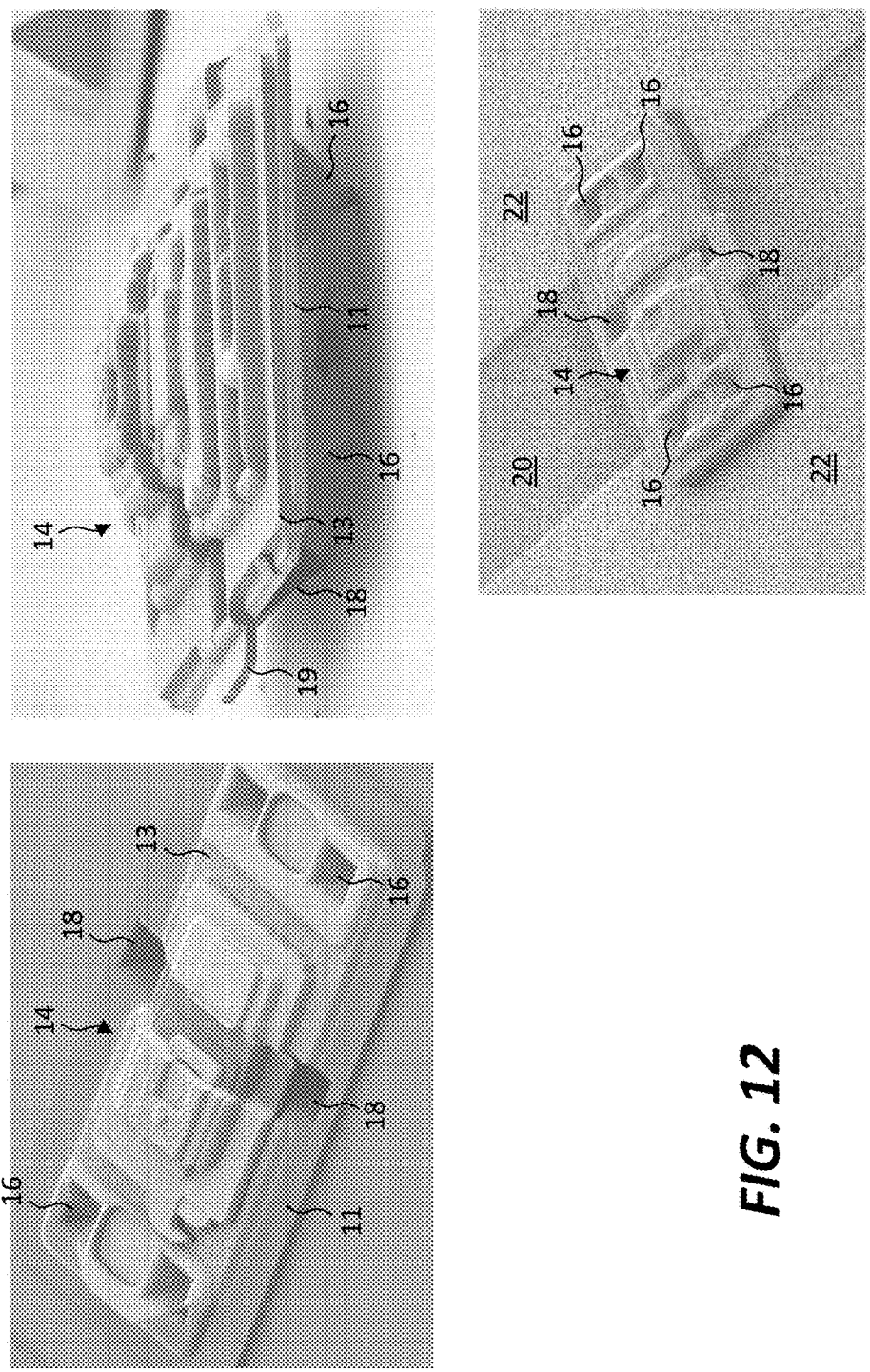
FIG. 12 shows micrographs having different magnifications and at different angles of a printable component having an LED circuit according to an illustrative embodiment of the present invention.

Referring to FIG. 12 in another constructed illustrative embodiment of the present invention, SEM micrographs of a printable component 10 having an LED circuit 14, as schematically illustrated in FIG. 1, are shown at different magnifications and angles. This illustrative embodiment includes four connection posts 16 and two wicking posts 18. The connection posts 16 are disposed in electrically shorted pairs to provide a redundant electrical connection to each destination substrate contact pad 22.

In some embodiments of the present invention, a first connection post 16 has a first height D1 and a second connection post 16 has a second height D2 different than the first height D2. The first and second connection posts 16 can be electrically connected to first and second different destination substrate contact pads 22, respectively, of a common destination substrate 20 that, in some embodiments, are electrically connected to different first and second layers (for example different metal layers such as a first metal layer and a different second metal layer) at different first and second depths in the destination substrate 20. The difference in the depths of the first and second layers can correspond to the difference in height of the first and second connection posts 16 so that the first connection post 16 is electrically connected to the first destination substrate connection pad 22 of the first metal layer at the first depth and the second connection post 16 is electrically connected to the second destination substrate connection pad 22 of the second metal layer at the second depth.

A printable component 10 can be an active component with a circuit 14, for example including one or more active elements such as electronic transistors or diodes or light-emitting diodes and photodiodes that produce an electrical current in response to ambient light. A printable component 10 can be a passive component, for example including one or more passive elements such as resistors, capacitors, or conductors. In some embodiments, the printable component 10 is a compound printable component 10 that includes both active and passive elements. The printable component 10 can be a semiconductor device having one or more semiconductor layers, such as an integrated circuit. The printable component 10 can be an unpackaged die. In some embodiments, the printable component 10 is a compound element having a plurality of active or passive elements or a combination of one or more active and one or more passive elements, such as multiple semiconductor devices with separate substrates, each with one or more active elements or passive elements, or one or more active and one or more passive elements. In certain embodiments, the plurality of elements is disposed and interconnected on a compound element substrate separate from the substrates of any semiconductor devices or a different substrate. The compound element can be micro-transfer printed itself after the elements have been arranged thereon. The printable components 10 can be electronic processors, controllers, drivers, light-emitting diodes, photodiodes, light-control devices, or light-management devices.

The printable components 10 made by methods in accordance with certain embodiments of the present invention can include or be a variety of chiplets having semiconductor structures, including a diode, a light-emitting diode (LED), a transistor, or a laser. Chiplets are small integrated circuits and can be unpackaged dies released from a chiplet source wafer and can be micro-transfer printed. Chiplets can have at least one of a width, length, and height from 2 to 5 µm, 5 to 10 µm, 10 to 20 µm, or 20 to 50 µm. Chiplets can have a doped or undoped semiconductor substrate thickness of 2 to 5 µm, 5 to 10 µm, 10 to 20 µm, or 20 to 50 µm. The chiplet or printable components 10 can be micro-light-emitting diodes with a length greater than width, for example having an aspect ratio greater than or equal to 2, 4, 8, 10, 20, or 50 and component contact pads 12 that are adjacent to the ends of the semiconductor printable components 10 along the length of the semiconductor printable components 10. In certain embodiments, structure enables low-precision manufacturing processes to electrically connect wires 13 to the component contact pads 12 without creating registration problems and possible unwanted electrical shorts or opens.

Printable components 10 can be small electronic integrated circuits, for example, having a size of about 5 microns to about 5000 microns in a dimension. The electronic circuits can include semiconductor materials (for example inorganic materials such as silicon or gallium arsenide, or inorganic materials) having various structures, including crystalline, microcrystalline, polycrystalline, or amorphous structures. In some embodiments, the printable components 10 are passive, for example including a conductor that, when used in a printed structure serves to electrically connect one conductor (e.g., a destination substrate contact pad 22) to another, forming an electrical jumper. The printable components 10 can also include insulating layers and structures such as silicon dioxide, nitride, and passivation layers and conductive layers or structures including wires 13 made of aluminum, titanium, silver, or gold that foam an electronic circuit. Connection posts 16 or component contact pads 12 can be formed of metals such as aluminum or polysilicon semiconductors. Methods and materials for making printable component 10 electronic circuits 14 include those used in the integrated circuit arts. Large numbers of such small integrated circuits are formed on a single source wafer 61. The printable components 10 are typically packed as closely as possible to use the surface area of the source wafer 61 as efficiently as possible.

In some embodiments, the printable components 10 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the printable component 10 or substrate materials, more benign environmental conditions can be used as compared to thin-film manufacturing processes. Thus, certain embodiments of the present invention have an advantage in that flexible substrates, such as polymeric substrates, that are intolerant of extreme processing conditions (e.g. heat, chemical, or mechanical processes) can be employed for the destination substrates 20. Furthermore, it has been demonstrated that crystalline semiconductor substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the printable components 10 can be formed in a microcrystalline, polycrystalline, or amorphous semiconductor layer.

The printable components 10 can be constructed using foundry fabrication processes used in the art. Layers of materials can be used, including materials such as metals, oxides, nitrides and other materials used in the integrated-circuit art. Each printable component 10 can be a complete semiconductor integrated circuit and can include, for example, transistors. The printable components 10 can have different sizes, for example, 1000 square microns or 10,000 square microns, 100,000 square microns, or 1 square mm, or larger, and can have variable aspect ratios, for example 1:1, 2:1, 5:1, or 10:1. The printable components 10 can be rectangular or can have other shapes.

In some embodiments of the present invention, the printable components 10 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet printable components 10 can be made in a semiconductor source wafer 61 (e.g., a silicon or GaN wafer) or a non-semiconductor wafer such as glass or plastic. Printable components 10 are formed using lithographic processes in an active layer on or in the source wafer 61. An empty release layer space gap 69 (where the sacrificial portion 62 is removed) is formed beneath the printable components 10 with tethers 68 connecting the printable components 10 to the source wafer 61 at anchor 66 locations in such a way that pressure applied against the printable components 10 breaks the tethers 68 to release the printable components 10 from the anchors 66 and the source wafer 61. Methods of forming such structures are described, for example, in the paper *AMOLED Displays using Transfer-Printed Integrated Circuits* and U.S. Pat. No. 8,889,485 referenced above. Lithographic processes for forming printable components 10 in a source wafer 61, for example transistors, wires, and capacitors, can be found in the integrated circuit art.

In some embodiments, the component contact pads 12 are omitted and the connection posts 16 are electrically connected to the circuit 14 with the wires 13. In some other embodiments, each component contact pad 12 and its respective connection post 16 are a single component (e.g., formed together as contact terminal). In certain embodiments, the component contact pads 12 are planar electrical connections formed on the printable component 10. Such component contact pads 12 are typically formed from metals such as aluminum or polysilicon using masking and deposition processes used in the art. In certain embodiments, the component contact pads 12 are electrically connected to the circuit 14 with wires 13. In some embodiments, the component contact pads 12 are directly electrically connected to the circuit 14 without intervening wires. In some embodiments, component contact pads 12 and the circuit 14, together with other functional structures formed in the active layer on the source wafer 61 make up the printable component 10, or chiplet.

The component contact pads 12 can be made using integrated circuit photolithographic methods. Likewise, the connection posts 16 can be made by etching one or more layers of metal evaporated or sputtered on the printable component 10. Such structures can also be made by forming a layer above the component substrate 11 surface, etching a well into the surface, filling it with a conductive material such as metal (for connection posts 16) or a dielectric (e.g., for wicking posts 18), and then removing the layer. In some embodiments, the connection posts 16 are electrically connected to the circuit 14 and the connection posts 16 and the circuit 14, together with other functional active or passive structures formed in the active layer on the source wafer, make up the printable component 10.

According to various embodiments of the present invention, the native source wafer 61 can be provided with the printable components 10, sacrificial portions 62, wicking posts 18, and connection posts 16 already formed (e.g., as a printable component source wafer 60), or they can be constructed as part of a process in accordance with some embodiments of the present invention.

Connection posts 16 are electrical connections formed on the component substrate 11 that, in certain embodiments, extend generally perpendicular to the surface of the component substrate 11. Such connection posts 16 can be formed from metals such as aluminum, titanium, tungsten, copper, silver, gold, or other conductive metals. The connection posts 16 can be formed by repeated masking and deposition processes that build up three-dimensional structures, as can the wicking posts 18. In some embodiments, the connection posts 16 are made of one or more high elastic modulus metals, such as tungsten. As used herein, a high elastic modulus is an elastic modulus sufficient to maintain the function and structure of the connection post 16 when pressed into a destination substrate contact pads 22, as described above.

The connection posts 16 and wicking posts 18 can have a variety of aspect ratios and typically have a peak area smaller than a base area. The connection posts 16 and wicking posts 18 can have a sharp point for embedding in or piercing the adhesive layer 24 or, in the case of the connection post 16, the backplane contact pads 22. Printable components 10 with protruding connection posts 16 are generally discussed in U.S. Pat. No. 8,889,485, the disclosure of which is incorporated by reference herein in its entirety.

In some embodiments, the connection posts 16 include a post material such as is provide in the dielectric layer 26 coated with an electrically conductive material different from the post material. The conductive material can be a solder that is melted to promote the electrical connection between the connection posts 16 and the destination substrate contact pad 22. The post material can be an electrically conductive metal or a doped or undoped semiconductor or an electrically insulating polymer, for example a resin, cured resin, or epoxy and can have any of a variety of hardness or elastic modulus values. In some embodiments, the post material is softer than the conductive material so that the conductive material can crumple when the connection post 16 is under mechanical pressure. In some embodiments, the conductive material is softer than the post material so that it deforms before the post material when under mechanical pressure. By deform is meant that the connection posts 16 or the destination substrate contact pads 22 or conductive material change shape as a consequence of printing.

Connection post 16 or post material can be a semiconductor materiel, such as silicon or GaN, formed by etching material from around the connection post 16. Coatings, such as the conductive material can be evaporated or sputtered over the post material structure and then pattern-wise etched to form a connection post 16. The conductive material can be a solder or other metal or metal alloy that flows under a relatively low temperature, for example less than 120 degrees C. In particular, the conductive material can have a melting point less than the melting point of the post material.

In some embodiments of the present invention, two or more connection posts 16 are directly electrically connected. In some embodiments, and as shown in FIG. 11, two or more connection posts 16 together form a group of connection posts 16. The connection posts 16 in a common group are electrically connected or shorted, for example, by a component contact pad 12. In a useful exemplary arrangement, the connection posts 16 in a common group are separated by a distance that is less than the distance between connection posts 16 in different groups so that the connection posts 16 within a group are located closer together than connection posts 16 in different groups. Multiple connection posts 16 that are electrically connected in a group provide a redundant means for connection to a common electrical connection, e.g., to a single destination substrate contact pad 22. As those skilled in the art will understand, it is important that electrical connections between the printable components 10 and an external electrical structure such as a destination substrate 20 are reliable and effective. By providing multiple connection posts 16 and connection posts 16 that are electrically connected in a group in the printable component 10, the likelihood of an electrical connection failure between the printable component 10 and an external device or structure such as the destination substrate contact pads 22 are reduced.

A destination substrate 20 is a different substrate than the component substrates 11 of the printable components 10 and is not native to the printable components 10. A destination substrate 20 can be a backplane and has two or more destination substrate contact pads 22 and one or more printable components 10 disposed thereon. In certain embodiments, each connection post 16 is in contact with, extends into, or extends through a destination substrate contact pad 22 of the destination substrate 20 to electrically connect the destination substrate contact pads 22 to the connection posts 16. Destination substrate contact pads 22 can be electrically conductive and connected through wires or conductive traces to other components or structures on a destination substrate 20.

A destination substrate contact pads 22 can be made of a relatively soft metal, such as tin, solder, or tin-based solder, to assist in forming good electrical contact with the connection posts 16 and adhesion with the printable components 10. As used herein, a soft metal may refer to a metal into which a connection post 16 can be pressed to form an electrical connection between the connection post 16 and the destination substrate contact pad 22. In such an arrangement, a destination substrate contact pad 22 can plastically deform and flow under mechanical pressure to provide good electrical connection between the connection post 16 and the destination substrate contact pad 22.

In some embodiments of the present invention, connection posts 16 include a soft metal and the destination substrate contact pads 22 include a high elastic modulus metal. In such an arrangement, the connection posts 16 can plastically deform and flow under mechanical pressure to provide a good electrical connection between the connection post 16 and the destination substrate contact pads 22.

In certain embodiments, the connection posts 16 are driven through the adhesive layer 24 to form an electrical connection with the destination substrate contact pads 22 beneath the adhesive layer 24. In certain embodiments, an adhesive layer 24 can be cured to more firmly adhere printable components 10 to a destination substrate 20 and maintain a robust electrical connection between the connection posts 16 and destination substrate contact pads 22 in the presence of mechanical stress. An adhesive layer 24 can undergo some shrinkage during the curing process that can further strengthen the electrical connectivity and adhesion between the connection post 16 and the destination substrate contact pads 22. As used herein, an adhesive layer can be or comprise a resin, photoresist, epoxy, viscous polymer, or silicone (e.g., an adhesive layer can be or comprise SU8).

A micro-transfer printing stamp 30 has a plurality of pillars 32 formed thereon and spatially aligned to printable components 10. A transfer stamp 30 can be made of an elastomeric material, such as PDMS. The pillars 32 protrude from and are spatially arranged on the transfer stamp 30 so that each pillar 32 can be aligned with a printable component 10. During printing, the pillars 32 are brought in contact with the printable components 10 and are moved in alignment with and towards the destination substrate 20 so that the connection posts 16 of the printable components 10 come in contact with the destination substrate contact pads 22 of the destination substrate 20.

In some embodiments of the present invention, connection posts 16 of printable components 10 are in contact with, are embedded in, or pierce the destination substrate contact pads 22 of the destination substrate 20 as shown in FIG. 7. In some embodiments, either or both of one or more of the connection posts 16 and the destination substrate contact pads 22 are deformed or crumpled into a non-planar shape or are deformed so that the surfaces of the connection posts 16 and the destination substrate contact pads 22 change shape on contact with each other. The deformation or crumpling can improve the electrical connection between the connection posts 16 and the destination substrate contact pads 22 by increasing the surface area that is in contact between the connection posts 16 and the destination substrate contact pads 22. To facilitate deformation, in some embodiments, two or more connection posts 16 have a composition softer than that of destination substrate contact pads 22 or destination substrate contact pads 22 have a composition softer than two or more connection posts 16.

In some embodiments, the destination substrate contact pads 22 include or are coated with a conductive material or solder. Connection posts 16 can contact, be embedded in, or pierce the conductive material. In some embodiments, destination substrate contact pad 22 has a first conductive layer and a second conductive layer over the first conductive layer, and the second conductive layer has a lower melting temperature than the first conductive layer. With a subsequent heat treatment, the solder can reflow and promote the electrical connection between the connection posts 16 and the destination substrate contact pads 22. In some embodiments, both connection posts 16 and destination substrate contact pads 22 include a layer of conductive material such as solder or have a layer of conductive material other than the material making up the connection posts 16 or destination substrate contact pads 22 that electrically connects the destination substrate contact pad 22 to the connection post 16. A heat treatment can also serve to weld the destination substrate contact pad 22 to the connection post 16. Welding can be facilitated by providing a common material on the surfaces of the connection posts 16 and the destination substrate contact pads 22.

The spatial distribution of the printable components 10 is a matter of design choice for the end product desired. In some embodiments of the present invention, all of the printable components 10 in a printable component source wafer 60 are transferred to the transfer stamp 30. In some embodiments, a subset of the printable components 10 in the printable component source wafer 60 is transferred. Similarly, in some embodiments of the present invention, all of the printable components 10 on the pillars 32 of the stamp array are transferred to the pillars 32 of the transfer stamp 30. In some embodiments, a subset of the printable components 10 on the pillars 32 of the transfer stamp 30 are transferred to the pillars 32 of the transfer stamp 30. By varying the number and arrangement of pillars 32 on a transfer stamp 30, the distribution of printable components 10 on the pillars 32 of the transfer stamp 30 can be likewise varied, as can the distribution of the printable components 10 on a destination substrate 20.

In some embodiments of the present invention, an electronically active substrate includes a destination substrate 20 having a plurality of destination substrate contact pads 22. A plurality of printable components 10 are distributed over the destination substrate 20. Each printable component 10 includes a component substrate 11, for example a semiconductor substrate, different from the destination substrate 20, for example a printed circuit board resin, glass, or epoxy substrate.

According to some embodiments of the present invention, a source wafer 61 can be provided with printable components 10 and component contact pads 12 and connection posts 16 already formed on the source wafer 61 (e.g., as a printable component source wafer 60). In some embodiments, an unprocessed source wafer 61 is provided and the printable components 10 formed or disposed on or in the source wafer 61. An unprocessed source wafer 61 is a substrate that does not yet include printable components 10. The unprocessed source wafer 61 can have other processing steps completed, for example, cleaning, deposition of material layers, or heat or chemical treatments, as are used in the photo-lithographic arts. Printable components 10 are formed, for example using photo-lithographic processes including forming masks over a source wafer 61, etching materials, removing masks, and depositing materials. Such processes are used in the photo-lithographic arts. Using such processes, printable components 10 are formed on or in a source wafer 61. In some embodiments, chiplets are transferred from a chiplet source wafer to the source wafer 61 to provide a circuit 14.

Certain embodiments of the present invention provide advantages over other printing methods described in the prior art. By employing connection posts 16 on printable components 10 and a printing method that provides printable components 10 on a destination substrate 20 with the connection posts 16 adjacent to the destination substrate 20, a low-cost method for printing printable components 10 in large quantities over a destination substrate 20 is provided. Furthermore, additional process steps for electrically connecting the printable components 10 to the destination substrate 20 are obviated.

The source wafer 61 and printable components 10, transfer stamp 30, and destination substrate 20 can be made separately and at different times or in different temporal orders or locations and provided in various process states.

In certain embodiments, methods can be iteratively applied to a single or multiple destination substrates 20. By repeatedly transferring sub-arrays of printable components 10 from a transfer stamp 30 to a destination substrate 20 and relatively moving the transfer stamp 30 and destination substrates 20 between stamping operations by a distance equal to the spacing of the selected printable components 10 in the transferred sub-array between each transfer of printable components 10, an array of printable components 10 formed at a high density on a source wafer can be transferred to a destination substrate 20 at a much lower density. In practice, the source wafer 61 is likely to be expensive, and forming printable components 10 with a high density on the source wafer 61 will reduce the cost of the printable components 10, especially as compared to forming printable components 10 on the destination substrate 20. Transferring the printable components 10 to a lower-density destination substrate 20 can be used, for example, if the printable components 10 manage elements distributed over the destination substrate 20, for example in a display, digital radiographic plate, or photovoltaic system.

In particular, in the case wherein a printable component 10 is an integrated circuit formed in a crystalline semiconductor material, the integrated circuit substrate provides sufficient cohesion, strength, and flexibility that it can adhere to the destination substrate 20 without breaking as the transfer stamp 30 is removed.

In comparison to thin-film manufacturing methods, using densely populated printable component source wafers 60 and transferring printable components 10 to a destination substrate 20 that requires only a sparse array of printable components 10 located thereon does not waste or require active layer material on a destination substrate 20. The present invention can also be used in transferring printable components 10 made with crystalline semiconductor materials that have higher performance than thin-film active components. Furthermore, the flatness, smoothness, chemical stability, and heat stability requirements for a destination substrate 20 used in embodiments of the present invention may be reduced because the adhesion and transfer process is not substantially limited by the material properties of the destination substrate 20. Manufacturing and material costs may be reduced because of high utilization rates of more expensive materials (e.g., the source substrate) and reduced material and processing requirements for the destination substrate 20.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

The invention has been described in detail with particular reference to certain embodiments thereof, but it will be understood that variations and modifications can be effected within the spirit and scope of the invention.

PARTS LIST

D1 connection post distance
D2 wicking post distance
D3 direction
10 printable component/printed component
11 component substrate
12 component contact pad
13 wire/electrical conductor
14 circuit
15 circuit contact pads
16 connection post
18 wicking post
19 broken tether
20 destination substrate
22 destination substrate contact pad
24 curable adhesive layer
26 dielectric layer
27 via
28 electrode
29 void
30 stamp
32 pillars
60 printable component source wafer
61 source wafer
62 sacrificial portion
64 form
66 anchor
68 tether
69 gap
100 provide printable component source wafer step
102 provide stamp step
104 provide destination substrate step
110 contact components with stamp step
120 align components to destination substrate step
130 micro-transfer print components to destination substrate step
140 adhesive wicking step
150 remove stamp step
160 cure adhesive step

What is claimed:

1. A printable component, comprising:
  a component substrate and one or more electrical conductors;
  one or more electrically conductive connection posts protruding from the component substrate to form an exposed electrical contact, each connection post electrically connected to at least one of the electrical conductors to conduct an electrical signal; and
  one or more wicking posts protruding from the component substrate, wherein the one or more wicking posts do not conduct an electrical signal and are electrically isolated from the one or more electrically conductive connection posts; and
  one or more broken tethers.

2. The printable component of claim 1, wherein the one or more wicking posts are not electrically conductive.

3. The printable component of claim 1, wherein the one or more wicking posts are electrically conductive or the one or more wicking posts are not connected to any electrical conductor.

4. The printable component of claim 1, comprising at least two connection posts and wherein the two connection posts are directly electrically connected.

5. The printable component of claim 1, comprising a circuit disposed in or on the component substrate, the circuit electrically connected to one or more of the electrical conductors and to one or more corresponding connection posts.

6. The printable component of claim 5, wherein (i) the circuit is formed in or on the component substrate or (ii) the component substrate is a first component substrate and the circuit is formed in or on a second component substrate different from and disposed on the first component substrate.

7. The printable component of claim 1, wherein the printable component is an active component having an active element, a passive component having a passive element, or a compound structure having a plurality of active elements, passive elements, or a combination of active and passive elements.

8. The printable component of claim 1, wherein the one or more wicking posts protrude from the component substrate a wicking post distance, the one or more connection posts protrude from the component substrate a connection post distance, and wherein the connection post distance is substantially equal to the wicking post distance.

9. The printable component of claim 1, wherein the one or more wicking posts protrude from the component substrate a wicking post distance, the one or more connection posts protrude from the component substrate a connection post distance, and wherein the connection post distance is greater than the wicking post distance.

10. A printable component source wafer, comprising:
    a plurality of sacrificial portions separated by anchor portions formed in a sacrificial layer of the printable component source wafer; and
    a plurality of printable components, wherein each printable component comprises
        a component substrate and one or more electrical conductors;
        one or more electrically conductive connection posts protruding from the component substrate to form an exposed electrical contact, each connection post electrically connected to at least one of the electrical conductors to conduct an electrical signal, and
        one or more wicking posts protruding from the component substrate, wherein the one or more wicking posts do not conduct an electrical signal and are electrically isolated from the one or more electrically conductive connection posts,
    wherein each printable component of the plurality of printable components is disposed over a corresponding sacrificial portion and connected to an anchor portion by a tether.

11. The printable component source wafer of claim 10, wherein the source wafer comprises wafer material and wherein:
    the wafer material is anisotropically etchable and the sacrificial portions are designated portions of the anisotropically etchable material;
    the sacrificial portions comprise material that is differentially etchable from the wafer material; or
    the sacrificial portions define a gap between the printable component and the wafer material.

12. The printable component source wafer of claim 10, wherein the one or more wicking posts are electrically conductive or the one or more wicking posts are not connected to any electrical conductor.

13. The printable component source wafer of claim 10, wherein the one or more wicking posts are not electrically conductive.

14. A destination substrate structure, comprising:
    a destination substrate having one or more electrically conductive contact pads;
    an adhesive layer disposed on the destination substrate; and
    one or more printable components, wherein each printable component comprises
        a component substrate and one or more electrical conductors;
        one or more electrically conductive connection posts protruding from the component substrate to form an exposed electrical contact, each connection post electrically connected to at least one of the electrical conductors to conduct an electrical signal, and
        one or more wicking posts protruding from the component substrate, wherein the one or more wicking posts do not conduct an electrical signal and are electrically isolated from the one or more electrically conductive connection posts,
    wherein each connection post of each printable component extends through the adhesive layer and is in electrical contact with a corresponding contact pad and each wicking post is in contact with the adhesive layer and spatially separate from every contact pad.

15. The destination substrate structure of claim 14, wherein the one or more wicking posts are not electrically conductive.

16. A printable component, comprising:
    a component substrate and one or more electrical conductors;
    one or more electrically conductive connection posts protruding from the component substrate to form an exposed electrical contact, each connection post electrically connected to at least one of the electrical conductors to conduct an electrical signal; and
    one or more wicking posts protruding from the component substrate, wherein the one or more wicking posts do not conduct an electrical signal and are electrically isolated from the one or more electrically conductive connection posts,
    wherein (i) the printable component comprises at least two connection posts and wherein at least one wicking post is between at least two of the at least two connection posts, (ii) at least one connection post is between two wicking posts or (iii) the printable component comprises at least two wicking posts located closer to the corners or edges of the component substrate than the connection posts in a direction parallel to a surface of the component substrate.

17. A printable component, comprising:
    a component substrate and one or more electrical conductors;
    one or more electrically conductive connection posts protruding from the component substrate to form an exposed electrical contact, each connection post electrically connected to at least one of the electrical conductors to conduct an electrical signal; and
    one or more wicking posts protruding from the component substrate, wherein the one or more wicking posts do not conduct an electrical signal and are electrically isolated from the one or more electrically conductive connection posts,
    wherein the connection post consists essentially of one or more connection post materials, the wicking post consists essentially of one or more wicking post materials, and at least one of the one or more wicking post materials is different from any of the one or more connection post materials.

18. A printable component, comprising:
a component substrate and one or more electrical conductors;
one or more electrically conductive connection posts protruding from the component substrate to form an exposed electrical contact, each connection post electrically connected to at least one of the electrical conductors to conduct an electrical signal; and
one or more wicking posts protruding from the component substrate, wherein the one or more wicking posts do not conduct an electrical signal and are electrically isolated from the one or more electrically conductive connection posts,
wherein the connection post consists essentially of one or more connection post materials, the wicking post consists essentially of one or more wicking post materials, and at least one of the one or more connection post materials is different from any of the one or more wicking post materials.

19. A printable component, comprising:
a component substrate and one or more electrical conductors;
one or more electrically conductive connection posts protruding from the component substrate to form an exposed electrical contact, each connection post electrically connected to at least one of the electrical conductors to conduct an electrical signal; and
one or more wicking posts protruding from the component substrate, wherein the one or more wicking posts do not conduct an electrical signal and are electrically isolated from the one or more electrically conductive connection posts,
wherein the printable component has at least one of a width, length, and height from 2 to 5 µm, 5 to 10 µm, 10 to 20 µm, or 20 to 50 µm.

20. A printable component, comprising:
a component substrate and one or more electrical conductors;
one or more electrically conductive connection posts protruding from the component substrate to form an exposed electrical contact, each connection post electrically connected to at least one of the electrical conductors to conduct an electrical signal; and
one or more wicking posts protruding from the component substrate, wherein the one or more wicking posts do not conduct an electrical signal and are electrically isolated from the one or more electrically conductive connection posts,
wherein the one or more wicking posts protrude from the component substrate a wicking post distance, the one or more connection posts protrude from the component substrate a connection post distance, and the connection post distance is greater than the wicking post distance.

* * * * *